(12) United States Patent
Kwon et al.

(10) Patent No.: US 9,040,351 B2
(45) Date of Patent: May 26, 2015

(54) STACK PACKAGES HAVING FASTENING ELEMENT AND HALOGEN-FREE INTER-PACKAGE CONNECTOR

(71) Applicant: Samsung Electronics Co., Ltd, Suwon-si, Gyeonggi-do (KR)

(72) Inventors: Heung-Kyu Kwon, Seongnam-si (KR); Jae-Wook Yoo, Suwon-si (KR); Hyon-Chol Kim, Hwaseong-si (KR); Su-Chang Lee, Seoul (KR); Min-Ok Na, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/339,563

(22) Filed: Jul. 24, 2014

(65) Prior Publication Data

US 2014/0335657 A1 Nov. 13, 2014

Related U.S. Application Data

(63) Continuation of application No. 13/459,843, filed on Apr. 30, 2012.

(30) Foreign Application Priority Data

May 2, 2011 (KR) ........................ 10-2011-0041563

(51) Int. Cl.
*H01L 23/52* (2006.01)
*H01L 25/00* (2006.01)
(Continued)

(52) U.S. Cl.
CPC ....... *H01L 25/50* (2013.01); *H01L 2224/16221* (2013.01); *H01L 2225/06503* (2013.01); *H01L 23/3128* (2013.01); *H01L 23/3737* (2013.01); *H01L 23/49816* (2013.01); *H01L 25/105* (2013.01); *H01L 24/48* (2013.01); *H01L 2224/16146* (2013.01); *H01L 2224/16227* (2013.01); *H01L 2224/48145* (2013.01); *H01L 2224/48227* (2013.01); *H01L 2224/73204* (2013.01); *H01L 2224/73253* (2013.01); *H01L 2224/73265* (2013.01);
(Continued)

(58) Field of Classification Search
CPC .......... H01L 2224/08221; H01L 2224/08225; H01L 2224/16221; H01L 2224/16225; H01L 2224/16227; H01L 2224/32145; H01L 2224/16145; H01L 2225/06513; H01L 2225/06517; H01L 2225/0652
See application file for complete search history.

(56) References Cited

U.S. PATENT DOCUMENTS 5,878,943 A * 3/1999 Nishikawa et al. ........... 228/205
5,956,606 A * 9/1999 Burnette ........................ 438/615
(Continued)

FOREIGN PATENT DOCUMENTS

| JP | 2008-166373 | 7/2008 |
| KR | 10-2004-0057640 | 7/2004 |
| KR | 10-2012-0031697 | 4/2012 |

*Primary Examiner* — Fernando L Toledo
*Assistant Examiner* — Bryan Junge
(74) *Attorney, Agent, or Firm* — Ellsworth IP Group PLLC

(57) ABSTRACT

A stack package includes a lower package including a lower package substrate and a lower semiconductor chip disposed on the lower package substrate, an upper package including an upper package substrate and an upper semiconductor chip disposed on the upper package substrate, a fastening element formed between a top surface of the lower semiconductor chip and a bottom surface of the upper package substrate, and a halogen-free inter-package connector connecting the lower package substrate to the upper package substrate.

20 Claims, 21 Drawing Sheets

(51) Int. Cl.
*H01L 23/373* (2006.01)
*H01L 23/498* (2006.01)
*H01L 25/10* (2006.01)
*H01L 21/56* (2006.01)
*H01L 21/768* (2006.01)
*H01L 23/31* (2006.01)
*H01L 23/00* (2006.01)

(52) U.S. Cl.
CPC .............. H01L 2924/15311 (2013.01); H01L 2924/15331 (2013.01); H01L 2924/18161 (2013.01); H01L 2225/06541 (2013.01); H01L 2225/06565 (2013.01); H01L 2225/06562 (2013.01); H01L 2224/16145 (2013.01); H01L 2224/16225 (2013.01); H01L 2224/32145 (2013.01); H01L 2224/32225 (2013.01); H01L 2924/1815 (2013.01); H01L 2225/1023 (2013.01); H01L 2225/1058 (2013.01); H01L 21/565 (2013.01); H01L 2924/3511 (2013.01); H01L 2224/45139 (2013.01); H01L 2224/83191 (2013.01); H01L 21/76802 (2013.01); H01L 21/76877 (2013.01); H01L 24/83 (2013.01); H01L 2224/83097 (2013.01); H01L 2924/37001 (2013.01)

(56) References Cited

U.S. PATENT DOCUMENTS

| | | | |
|---|---|---|---|
| 6,960,827 B2 * | 11/2005 | Nishimura et al. | 257/723 |
| 7,042,088 B2 * | 5/2006 | Ho | 257/738 |
| 7,737,552 B2 * | 6/2010 | Beyne | 257/724 |
| 7,816,183 B2 | 10/2010 | Kawata | |
| 8,198,131 B2 * | 6/2012 | Weng et al. | 438/107 |
| 8,269,335 B2 * | 9/2012 | Osumi | 257/697 |
| 8,299,595 B2 * | 10/2012 | Yoon et al. | 257/686 |
| 2005/0133572 A1 * | 6/2005 | Brese et al. | 228/180.22 |
| 2006/0125096 A1 * | 6/2006 | Shiozawa et al. | 257/737 |
| 2007/0045788 A1 * | 3/2007 | Suzuki et al. | 257/666 |
| 2008/0157353 A1 * | 7/2008 | Watanabe et al. | 257/734 |
| 2010/0090323 A1 * | 4/2010 | Shinoda et al. | 257/686 |
| 2010/0148332 A1 * | 6/2010 | Kajiki | 257/678 |
| 2010/0171207 A1 * | 7/2010 | Shen et al. | 257/686 |
| 2010/0213591 A1 * | 8/2010 | Ho et al. | 257/686 |
| 2012/0074586 A1 | 3/2012 | Seo et al. | |

* cited by examiner

STACK PACKAGES HAVING FASTENING ELEMENT AND HALOGEN-FREE INTER-PACKAGE CONNECTOR

CROSS-REFERENCE TO RELATED APPLICATIONS

This is a Continuation application of prior application Ser. No. 13/459,843, filed on Apr. 30, 2012 in the U.S. Patent and Trademark Office and claims priority from and the benefit under 35 U.S.C. §119 of Korean Patent Application No. 10-2011-0041563, filed on May 2, 2011, in the Korean Intellectual Property Office (KIPO), the disclosure of which is hereby incorporated by reference in their entirety for all purposes as if fully set forth herein.

BACKGROUND

1. Field

Exemplary embodiments of the present general inventive concept relate to a stack package including a fastening element and a halogen-free inter-package connector; an electronic system; and a method of manufacturing a stack package.

2. Discussion of the Background

A package stack structure has been suggested to enhance integration density of a semiconductor device and miniaturize an electronic system.

SUMMARY

Exemplary embodiments of the present general inventive concept provide a stack package.

Additional aspects and advantages of the present general inventive concept will be set forth in part in the description which follows and, in part, will be obvious from the description, or may be learned by practice of the general inventive concept.

Exemplary embodiments of the present general inventive concept provide a stack package having a fastening element and a halogen-free inter-package connector.

Exemplary embodiments of the present general inventive concept further provide fastening elements with various shapes.

Exemplary embodiments of the present general inventive concept also provide halogen-free inter-package connectors with various shapes.

Exemplary embodiments of the present general inventive concept also provide an electronic system including a stack package.

Exemplary embodiments of the present general inventive concept also provide a method of fabricating a stack package.

Exemplary embodiments of the present general inventive concept also provide a method of forming various fastening elements.

Exemplary embodiments of the present general inventive concept also provide a method of forming various inter-package connectors.

Exemplary embodiments of the present general inventive concept also provide a stack package including a lower package including a lower package substrate and a lower semiconductor chip disposed on the lower package substrate, an upper package including an upper package substrate and an upper semiconductor chip disposed on the upper package substrate, a fastening element formed between a top surface of the lower semiconductor chip and a bottom surface of the upper package substrate, and a halogen-free inter-package connector to connect the lower package substrate and the upper package substrate.

The package may further include an air space disposed between the fastening element and the inter-package connector.

The fastening element may be in direct contact with the top surface of the lower semiconductor chip and the bottom surface of the upper package substrate.

The fastening element may include a thermosetting resin.

The lower semiconductor package may include a lower molding material surrounding a side surface of the lower semiconductor chip and a side surface of the inter-package connector.

The lower molding material may cover the top surface of the lower semiconductor chip.

The lower molding material may expose a part of the top surface of the lower semiconductor chip.

The fastening element may be disposed on a part of the top surface of the lower semiconductor chip and a top surface of the lower molding material.

The lower molding material may surround a lower side surface of the inter-package connector, and expose an upper side surface of the inter-package connector.

The halogen-free inter-package connector may include a solder material.

The halogen-free inter-package connector may include a lower inter-package connector and an upper inter-package connector.

The lower inter-package connector may have a smaller volume than the upper inter-package connector.

The halogen-free inter-package connector may include an intermediate inter-package connector disposed between the lower inter-package connector and the upper inter-package connector.

The intermediate inter-package connector may include a conductive particle and an insulating resin.

Exemplary embodiments of the present general inventive concept also provide a stack package including a lower package including a lower package substrate, a first lower land disposed on a top surface of the lower package substrate, a second lower land disposed on a bottom surface of the lower package substrate, a lower semiconductor chip disposed on the top surface of the lower package substrate, and a lower molding material surrounding a side surface of the lower semiconductor chip, an upper package including an upper package substrate, a first upper land disposed on a top surface of the upper package substrate, a second upper land disposed on a bottom surface of the upper package substrate, and an upper semiconductor chip disposed on the top surface of the upper package substrate, an adhesive fastening element disposed between the lower semiconductor chip and the upper package substrate, a halogen-free inter-package connector separated from the fastening element and electrically connecting the first lower land to the second upper land. An air space may exist between the lower molding material, the upper package substrate, the fastening element and the inter-package connector.

Exemplary embodiments of the present general inventive concept also provide a method including preparing an upper package in which an upper semiconductor chip is disposed on an upper package substrate, preparing a lower package in which a lower semiconductor chip is disposed on a lower package substrate, forming a fastening element between a top surface of the lower semiconductor chip and a bottom surface of the upper package substrate, and forming a halogen-free inter-package connector between the upper package substrate and the lower package substrate.

The halogen-free inter-package connector may include tin, silver, and copper.

The upper package substrate may include a first upper land disposed on its top surface, a second upper land disposed on its bottom, and an upper substrate interconnection electrically connecting the first upper land to the second upper land. The lower package substrate may include a first lower land disposed on its top surface, a second lower land disposed on its bottom, and a lower substrate interconnection electrically connecting the first lower land to the second lower land, and the halogen-free inter-package connector may electrically connect the second upper land to the first lower land.

Forming the halogen-free inter-package connector may include forming an upper inter-package connector in contact with the second upper land, forming a lower inter-package connector in contact with the first lower land, and heating the upper inter-package connector and the lower inter-package connector in a gas atmosphere containing hydrogen to electrically connect the upper inter-package connector to the lower inter-package connector.

The gas containing hydrogen may be hydrogen gas or formic acid gas.

Heating the upper inter-package connector and the lower inter-package connector may be performed at a temperature of 230 to 245° C.

Forming the halogen-free inter-package connector may include forming an intermediate inter-package connector between the upper inter-package connector and the lower inter-package connector.

Forming the halogen-free inter-package connector may include heating surfaces of the upper inter-package connector and the lower inter-package connector without being in contact with a flux containing halogen.

Forming the fastening element may include providing a fastening element that is not hardened on the top surface of the lower semiconductor chip, and hardening the fastening element that is not hardened.

Hardening the fastening element may include heating the fastening element at a temperature between 125° C. and 175° C.

The fastening element may include an adhesive epoxy resin.

Forming the fastening element may include forming an air space between a side surface of the fastening element and the inter-package connector.

Forming the fastening element may include forming a lower molding material covering a side surface of the lower semiconductor chip and exposing a top surface thereof and forming the fastening element on a top surface of the lower molding material.

Exemplary embodiments of the present general inventive concept also provide a method including preparing an upper package including an upper package substrate which includes a first upper land disposed on its top surface and a second upper land disposed on its bottom and an upper semiconductor chip disposed on the top surface of the upper package substrate, preparing a lower package including a lower package substrate which includes a first lower land disposed on its top surface and a second lower land disposed on its bottom, a lower semiconductor chip disposed on the top surface of the lower package substrate, and a lower molding material surrounding a side surface of the lower semiconductor chip, forming a fastening element between the top surface of the lower semiconductor chip and the bottom surface of the upper package substrate, and forming an inter-package connector penetrating the lower molding material to be formed between the second upper land and the first lower land, and spaced apart from the fastening element.

The upper semiconductor chip may include an input/output unit electrically connected to the first upper land via a wire, and the lower semiconductor chip may be disposed in a flip-chip manner using chip bumps and include an air space formed between the fastening element and the inter-package connector.

Details of other exemplary embodiments of the present general inventive concept are included in the detailed description and the drawings.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE ILLUSTRATED EMBODIMENTS

Figure 1A:
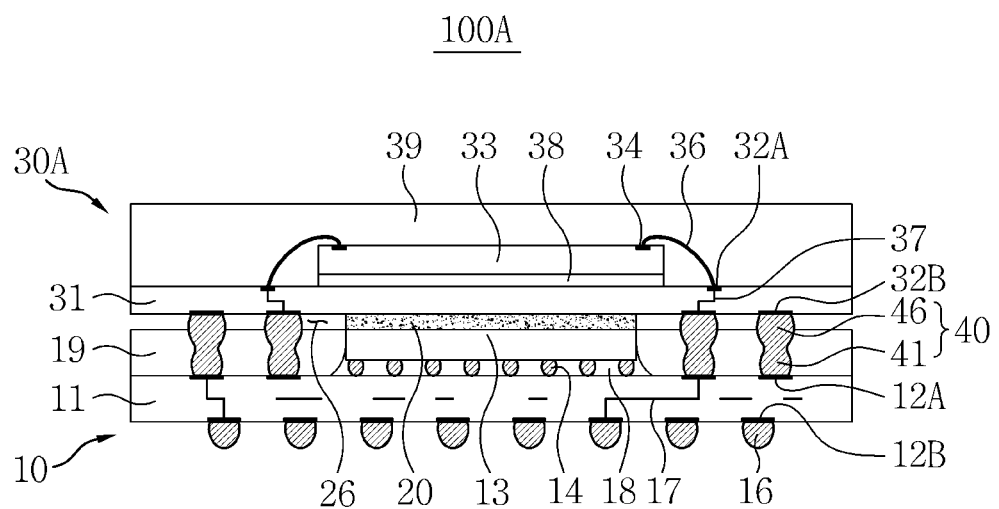
FIGS. 1A to 1G are cross-sectional views of stack packages according to various exemplary embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

Relative terms such as "above" or "below" or "upper" or "lower" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms used herein should be interpreted as having a meaning that is consistent with their meaning in the context of this disclosure and the relevant art and will not be interpreted in an idealized or overly formal sense unless expressly so defined herein.

FIGS. 1A to 1G are schematic lateral views of stack packages according to various embodiments of the inventive concept. For the purpose of clarity of the inventive concept, semiconductor chips are illustrated in a lateral view, and packages substrates are illustrated in a conceptive cross-sectional view.

Referring to FIG. 1A, a stack package 100A may include a lower package 10, an upper package 30A, a fastening element 20 and halogen-free inter-package connectors 40.

The lower package 10 may include a lower semiconductor chip 13 mounted on a lower package substrate 11. The lower package substrate 11 may be formed of a rigid printed circuit board, a flexible printed circuit board, or a rigid-flexible printed circuit board. The lower package substrate 11 may include first lower lands 12A, second lower lands 12B, and lower substrate interconnections 17. The first lower lands 12A may be electrically connected to the second lower lands 12B by the lower substrate interconnections 17.

The lower semiconductor chip 13 may include a logic semiconductor device, such as a microprocessor, a semiconductor memory chip, or the like. The lower semiconductor chip 13 may be connected in a flip chip manner using chip bumps 14 on the lower package substrate 11. The chip bumps 14 may include a mesa-type metal pad or a solder material. A lower underfill material 18 surrounding the chip bumps 14 may be filled between the lower package substrate 11 and the lower semiconductor chip 13. The lower underfill material 18 may include an adhesive resin. For example, the resin may include a rosin resin, an epoxy resin, or other various synthetic resins. The lower semiconductor chip 13 may be mounted on the lower package substrate 11 to be electrically connected thereto using an anisotropic conductive film or an anisotropic conductive paste such that the lower underfill material 18 may be omitted. The lower underfill material 18 may be replaced with an anisotropic conductive film or an anisotropic conductive paste.

The lower package 10 may further include a lower molding material 19 formed on the lower package substrate 11 and at least partially or completely surrounding side surfaces of the lower semiconductor chip 13. The lower molding material 19 may not be formed on the top surface of the lower semiconductor chip 13. That is, a surface of the lower semiconductor chip 13 may be exposed through the lower molding material 19. The lower molding material 19 may include an epoxy resin.

Board connection solders 16 may be formed on the bottom surface of the lower package substrate 11. The board connection solders 16 may be electrically connected to the halogen-free inter-package connectors 40 through the first and second lower lands 12A and 12B and the lower substrate interconnections 17.

The upper package 30A may include an upper semiconductor chip 33 mounted on an upper package substrate 31. The upper package substrate 31 may be formed of a rigid printed circuit board, a flexible printed circuit board or a rigid-flexible printed circuit board. The upper package substrate 31 may include first upper lands 32A, second upper lands 32B, and upper substrate interconnections 37. The upper semiconductor chip 33 may include a memory semiconductor device, a semiconductor memory chip, or the like. The upper semiconductor chip 33 may be bonded to the upper package substrate 31 through a chip bonding material 38, such as a die attach film (DAF). The upper semiconductor chip 33 may include input/output units 34. The input/output units 34 may be electrically connected to the first upper lands 32A of the upper package substrate 31 through wires 36. The first upper lands 32A may be electrically connected to the second upper lands 32B via the upper substrate interconnections 37. The upper package 30A may further include an upper molding material 39 formed on the upper package substrate 31 and surrounding top and side surfaces of the lower semiconductor chip 33. The upper molding material 39 may be formed of an epoxy resin.

The fastening element 20 may be directly formed between the top surface of the lower semiconductor chip 13 and the bottom surface of the upper package substrate 31. The fastening element 20 may be formed of a thermosetting resin exhibiting adhesion properties. For example, the fastening element 20 may be formed of a polymer resin, such as an epoxy resin. The fastening element 20 may further include a filler and/or a thermal conductive particle. The fastening element 20 may physically bond or fix the lower semiconductor chip 13 to the upper package substrate 31. The fastening element 20 may decrease, prevent, or alleviate warpage of the packages due to the coefficient of thermal expansion of the lower package substrate 11, the lower semiconductor chip 13, the lower molding material 19, the upper package substrate 31, the upper semiconductor chip 33, and/or the upper molding material 39, so that a physical connection between the halogen-free inter-package connectors 40, the chip bumps 14, and/or the board connection solders 16 may be maintained and stabilized. An air space 26 may be formed outside of the side surface of the fastening element 20. More specifically, the air space 26 may exist between the fastening element 20 and the halogen-free inter-package connectors 40. Further, the lower molding material 19 may surround lower side surfaces of the halogen-free inter-package connectors 40 and expose the upper side surfaces of the halogen-free inter-package connectors 40. In the drawing, the side surface of the fastening element 20 is illustrated to be vertically arranged with the side surface of the lower semiconductor chip 13, however, aspects are not limited thereto such that the fastening element 20 may expose at least a portion of the top surface of the lower semiconductor chip 13, and may be formed to extend toward a top surface of the lower molding material 19, which will be described hereinafter in association with other drawings of the specification.

The halogen-free inter-package connectors 40 may be disposed between the second upper land 32B and the first lower land 12A. The halogen-free inter-package connectors 40 may include lower inter-package connectors 41 and upper inter-package connectors 46. The upper inter-package connectors 46 may be formed to have a greater size or volume than the lower inter-package connectors 41. However, aspects need not be limited thereto such that the halogen-free inter-package connectors 40 may be any of various or similar shapes, at least some of which will described hereinafter.

The halogen-free inter-package connectors 40 may not include halogen group elements, such as fluorine, chlorine, bromine, and/or iodine. Halogen-free may be understood to denote not substantially containing halogen elements or being substantially free or completely free of halogen elements.

Halogen elements may be carcinogens, and may emit dioxin during combustion, and thus have been known to be harmful to the environment. The halogen-free inter-package connectors 40 do not substantially contain a halogen element, and thus are environment-friendly components. Further, the halogen-free inter-package connectors 40 may contain a small amount of a halogen element in compliance with the international environmental standard. Further description thereof will be provided below.

The halogen-free inter-package connectors 40 may include a solder material. For example, the halogen-free inter-package connectors 40 may include tin (Sn), silver (Ag), and copper (Cu). The halogen-free inter-package connectors 40 may further include nickel (Ni).

Figure 1B:
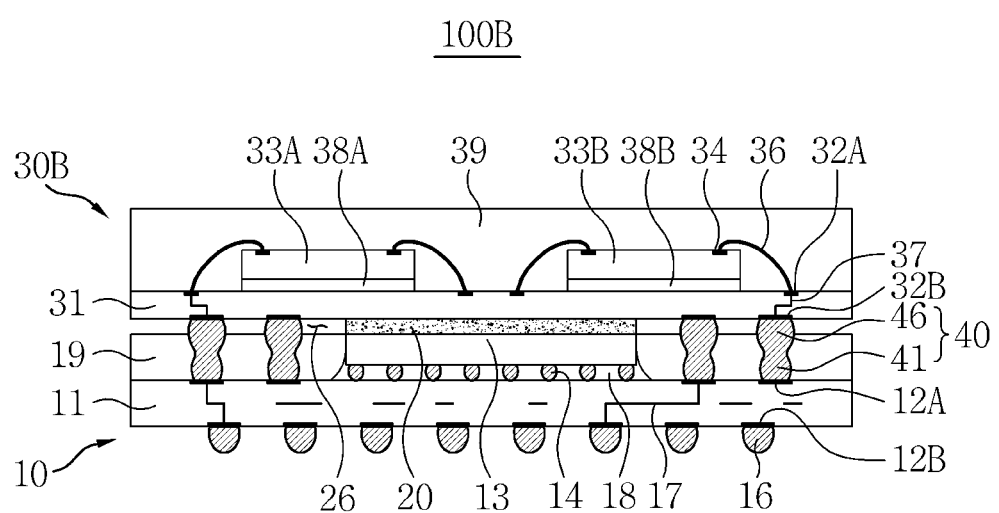
Figure 1C:
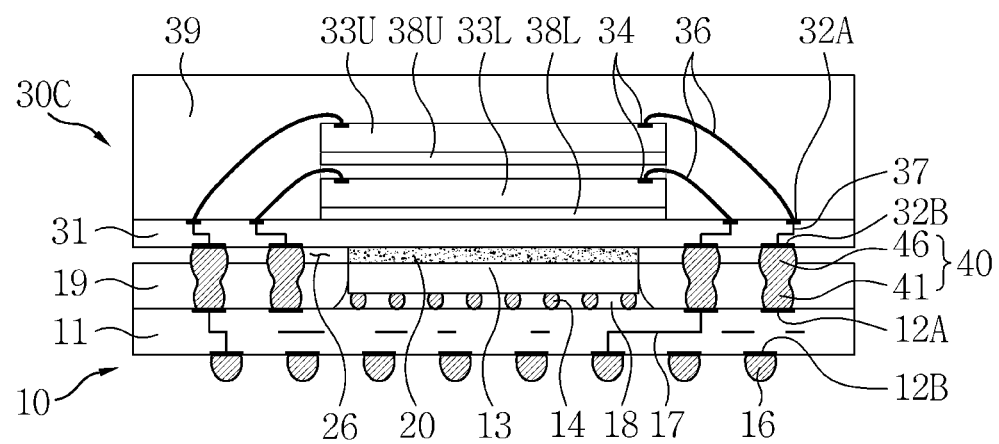

Referring to FIG. 1B, compared with the stack package 100A illustrated in FIG. 1A, in a stack package 100B, an upper package 30B may include at least two upper semiconductor chips 33A and 33B. While the upper semiconductor chips 33A and 33B are illustrated as disposed in a parallel or symmetrical manner, one of the two chips may be horizontally rotated by 90°. In this case, the chip that is rotated by 90° may exhibit a bonding wire on front and back sides of the chip, which is different from as illustrated in the drawing.

Referring to FIG. 10, compared with the stack packages 100A and 100B illustrated in FIGS. 1A and 1B, respectively, a stack package 100C may include a plurality of stacked upper semiconductor chips 33U and 33L. While it is illustrated in the drawing that two chips are stacked for clarity, aspects need not be limited thereto such that more chips may be stacked. For example, four, eight, or more chips may be stacked. At least one of two chips may be rotated by 90°. When four or more chips are stacked, chips directly stacked thereon or therebelow may be stacked to cross each other by 90°, or may be stacked to rotate and overlap by less than 90°. Further, each of the stacked upper semiconductor chips 33U and 33L may include chip bonding material 38U and 38L, respectively, such as die attach films (DAF).

Figure 1D:
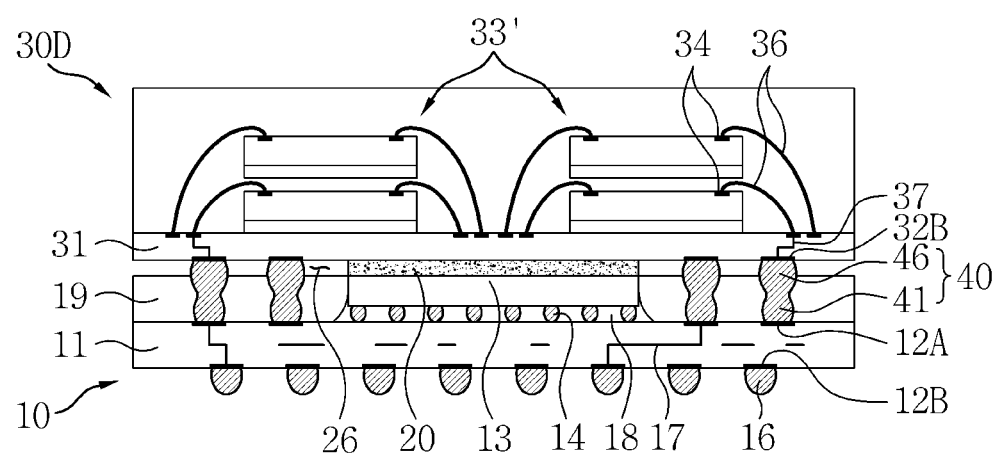

Referring to FIG. 1D, a stack package 100D may include upper semiconductor chips 33' in which the plurality of stack packages 100A to 100C illustrated in FIGS. 1A to 10, are stacked in a plurality of groups. While it is illustrated that four chips are stacked, aspects need not be limited thereto. Specifically, a pair of the upper semiconductor chips 33' may be separated and disposed in two groups in a stacked manner, and the chips may be disposed in more groups in which more groups are stacked. Each of the chips may be disposed in a rotated manner by group or singly by 90°.

Figure 1E:
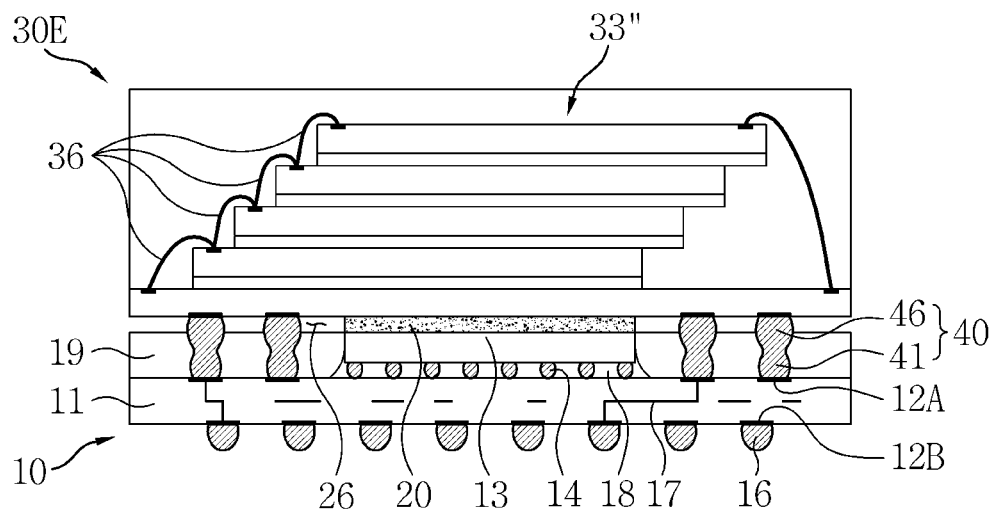

Referring to FIG. 1E, a stack package 100E may include upper semiconductor chips 33" stacked in a cascade form. Input/output units 34 of the upper semiconductor chips 33" stacked in a cascade form may be connected individually or commonly through wires 36.

Figure 1F:
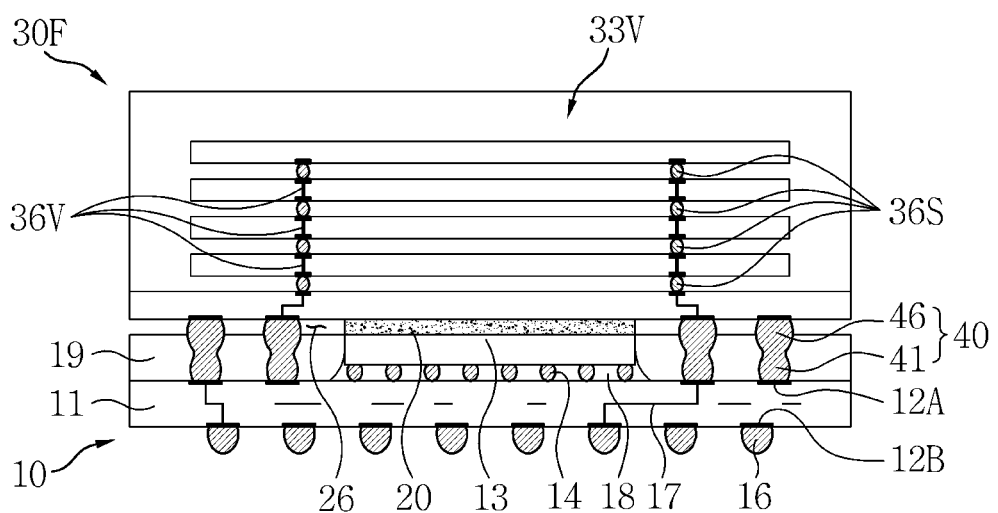

Referring to FIG. 1F, a stack package 100F may include upper semiconductor chips 33V electrically connected to each other using silicon through-vias 36V. The silicon through-vias 36V may be electrically connected to each other using solder balls 36S. An under fill material may be filled between the upper semiconductor chips 33V. The underfill material is not shown in FIG. 1F. Illustrated exemplary embodiments of the general inventive concept may be variously modified and/or combined. For example, the upper chips may include groups electrically connected to each other using the wires 36 and groups electrically connected to each other using the silicon through-vias 36V. The upper chips may include groups stacked in various shapes and various numbers of groups stacked in various shapes and combinations of shapes.

Figure 1G:
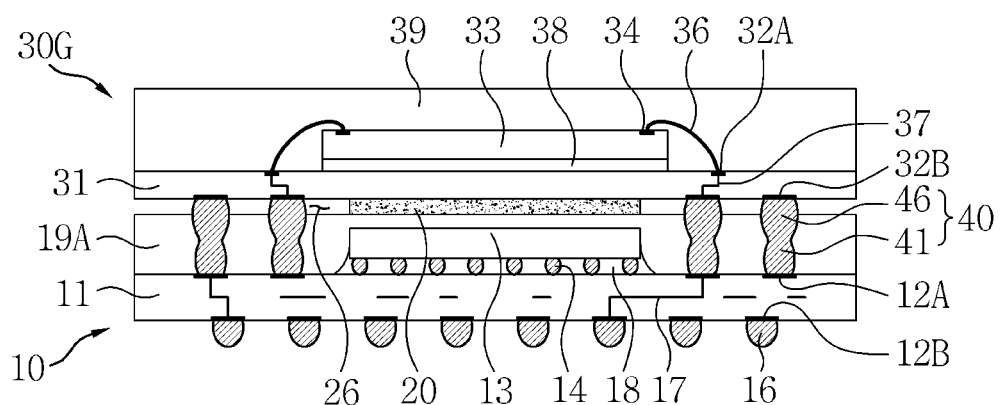

Referring to FIG. 1G, in a stack package 100G, a lower molding material 19A may cover a top surface of the lower semiconductor chip 13. Therefore, a fastening element 20 may be formed between the lower molding material 19A covering the top surface of the lower semiconductor chip 13 and the upper package substrate 31. The exemplary embodiment illustrated in FIG. 1G may be modified in view of and/or combined with the stack packages 100A to 100F according to various exemplary embodiments illustrated in FIGS. 1A to 1F.

Figure 2A:
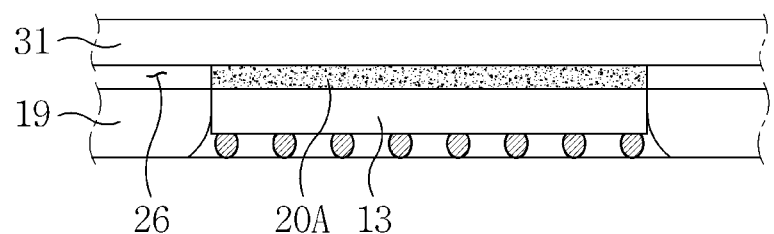
FIGS. 2A to 2G illustrate fastening elements of stack packages according to various exemplary embodiments of the present general inventive concept.

FIGS. 2A to 2G illustrate fastening elements of stack packages according to various exemplary embodiments of the present general inventive concept. Referring to FIG. 2A, a fastening element 20A may be provided to be in direct contact between an exposed top surface of lower semiconductor chip 13 and a lower package substrate 31. A lower molding material 19 may partially or entirely expose the top surface of the lower semiconductor chip 13. In addition, a top surface of the lower molding material 19 may be disposed at the same level as, a lower level than, or a higher level than the top surface of the lower semiconductor chip 13. The top surface of the lower molding material 19 may be disposed at a higher level than the top surface of the lower semiconductor chip 13. As described above, an air space 26 may exist outside of a side surface of the fastening element 20A.

Figure 2B:
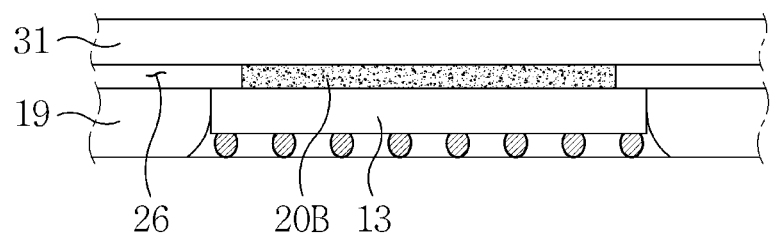

Referring to FIG. 2B, a fastening element 20B may be formed to expose a part of the top surface of the lower semiconductor chip 13, i.e., the fastening element 20B may not extend to cover the entire top surface of the lower semiconductor chip 13.

Figure 2C:
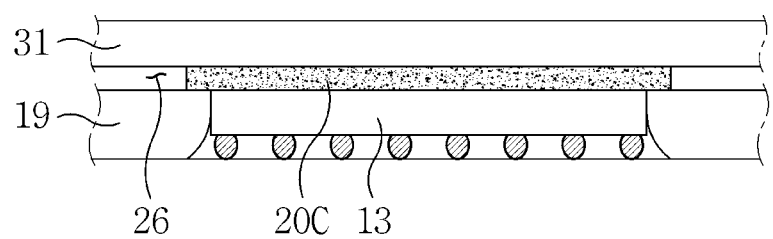

Referring to FIG. 2C, a fastening element 20C may entirely cover the top surface of the lower semiconductor chip 13 and extend toward the top surface of the lower molding material 19, i.e., the fastening element 20C may extend beyond the top surface of the lower semiconductor chip 13.

Figure 2D:
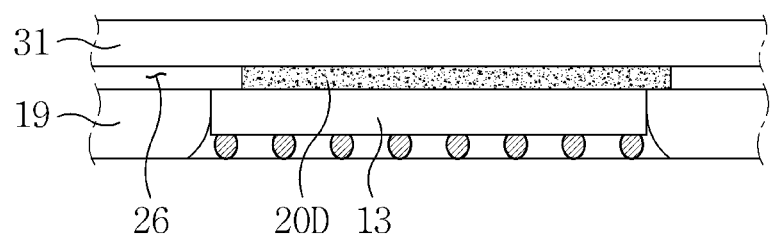

Referring to FIG. 2D, a fastening element 20D may expose a part of the top surface of the lower semiconductor chip 13 and cover a part of the top surface of the lower molding material 19, i.e., the fastening element 20D may extend beyond at least one side of the top surface of the lower semiconductor chip 13 and may not extend beyond at least one side of the surface of the lower semiconductor chip 13. Two or more shapes of the fastening elements illustrated in FIGS. 2A to 2D may be modified and/or combined between the upper package substrate 31 and the lower package substrate 19.

Figure 2E:
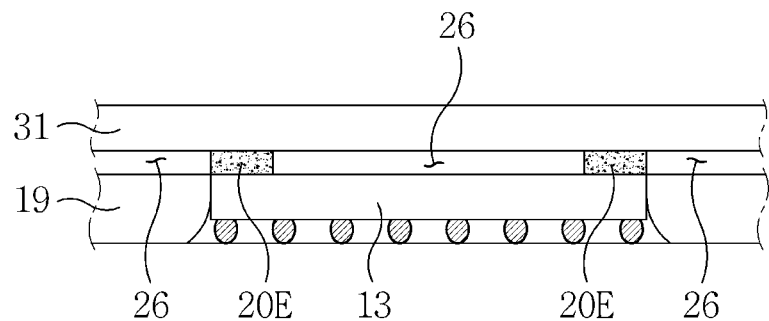

Referring to FIG. 2E, a fastening element 20E may be formed along an outer circumference or perimeter of the lower semiconductor chip 13. Since FIG. 2E is a longitudinal cross-sectional view, the fastening element 20E may be formed in an integral-type looped curve form. A plurality of fastening elements 20E may be formed in a separated bar or island shape. An air space 26 may exist between the fastening elements 20E.

Figure 2F:
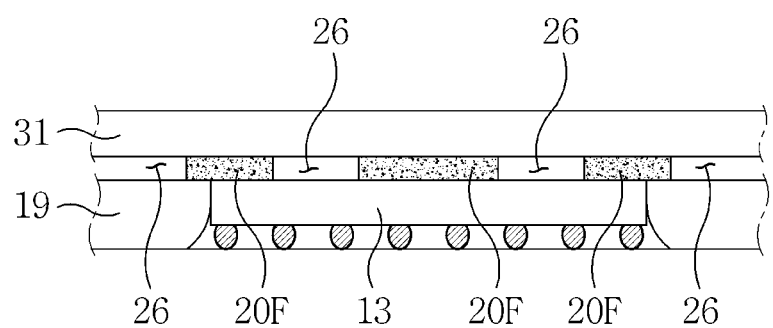

Referring to FIG. 2F, a plurality of fastening elements 20F may be formed in a separated manner on the top surface of the lower semiconductor chip 13 and/or the top surface of the lower molding material 19. An air space 26 may exist between the fastening elements 20F.

Figure 2G:
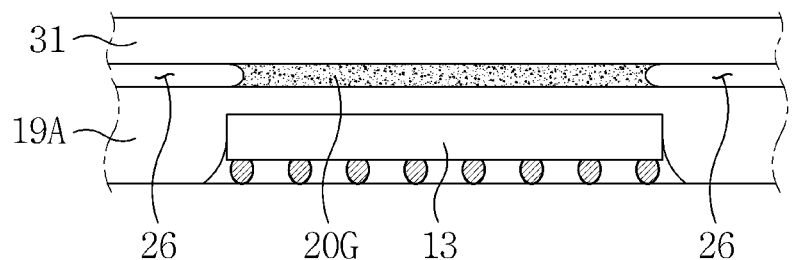

Referring to FIG. 2G, a fastening element 20G may be formed on the top surface of the lower molding material 19 covering the top surface of the lower semiconductor chip 13. The embodiment of FIG. 2G may be understood with reference to FIG. 1G. The lower molding material 19A illustrated in FIG. 2G may be replaced by the lower molding material 19 as illustrated in FIGS. 2A to 2F, i.e., the lower molding material 19A illustrated in FIG. 2G may be modified in view of and/or combined with those illustrated in FIGS. 2A to 2F.

FIGS. 3A to 3F schematically illustrate fastening elements according to various exemplary embodiments of the present general inventive concept shown in a cross-sectional plan view.

Figure 3A:
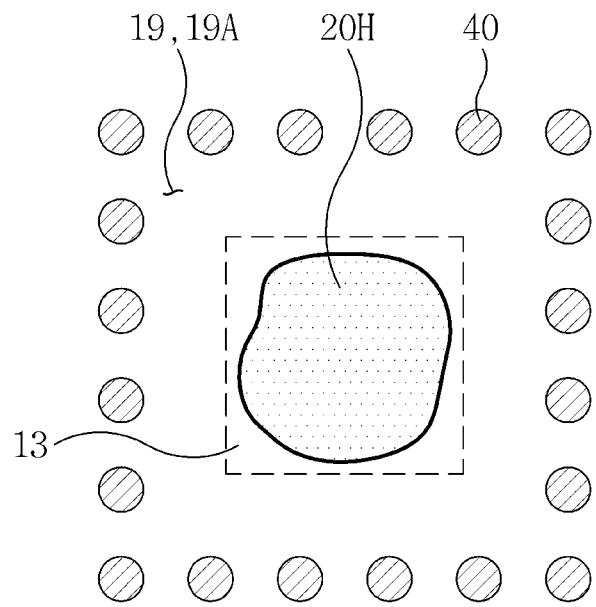
FIGS. 3A to 3F schematically illustrate fastening elements according to various exemplary embodiments of the present general inventive concept shown in a cross-sectional plan view.

Referring to FIG. 3A, a fastening element 20H may be formed within a perimeter of a lower semiconductor chip 13. That is, the fastening element 20H may not be formed on a top surface of the lower molding material 19, or may not be formed outside a perimeter of a portion of the top surface of the lower molding material 19A corresponding the lower semiconductor chip 13.

Figure 3B:
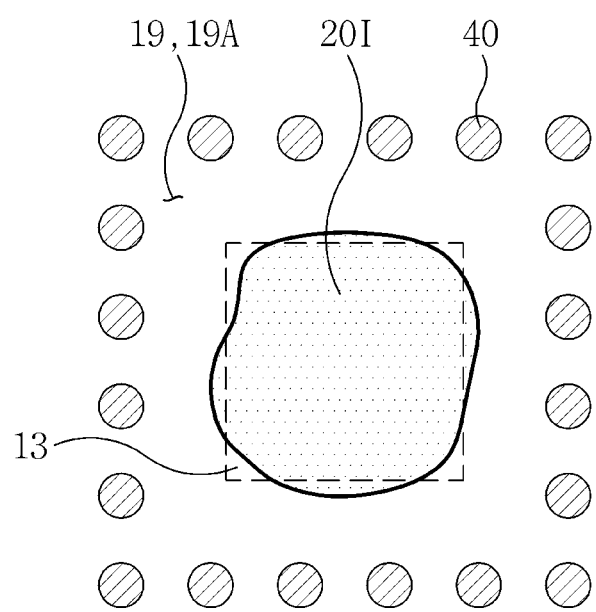

Referring to FIG. 3B, a fastening element 20I may remain within a perimeter of the top surface of the lower semiconductor chip 13, and at the same time, the fastening element 20I may partially extend beyond a perimeter of the top surface of the lower semiconductor chip 13. That is, the fastening element 20I may be contained within portions of the perimeter of the top surface of the lower semiconductor chip 13 and may extend beyond portions of the perimeter of the top surface of the lower semiconductor chip 13 to the top surface of the lower molding material 19, or the fastening element 20I may be disposed within portions of the top surface of the lower molding material 19A corresponding to within the perimeter of the top surface of the lower semiconductor chip 13 and may extend to portions of the top surface of the lower molding material 19A corresponding to beyond the perimeter of the top surface of the lower semiconductor chip 13.

Figure 3C:
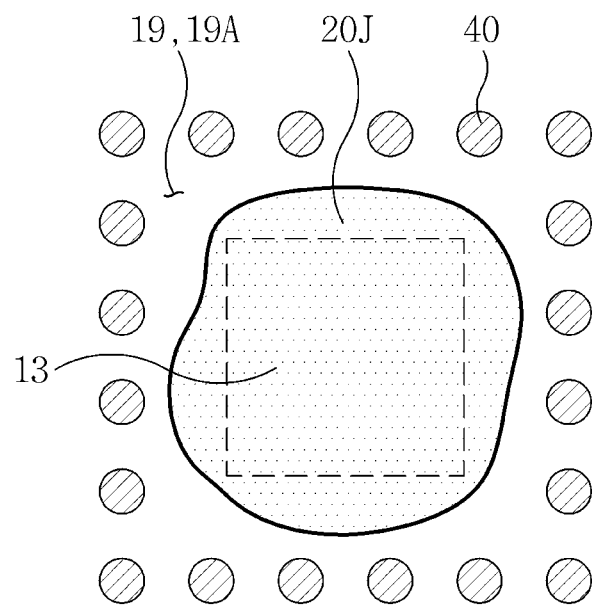

Referring to FIG. 3C, a fastening element 20J may entirely cover the top surface of the lower semiconductor chip 13 and may be formed on the top surfaces of the lower molding material 19 or 19A. That is, the fastening element 20J may extend beyond the entire perimeter of the lower semiconductor chip 13 to the top surface of the lower molding material 19, or the fastening element 20J may be disposed on the top surface of the lower molding material 19A at a position corresponding to the lower semiconductor chip 13 and extend on the top surface of the lower molding material 19A beyond an area corresponding to the perimeter of the top surface of the lower semiconductor chip 13.

Figure 3D:
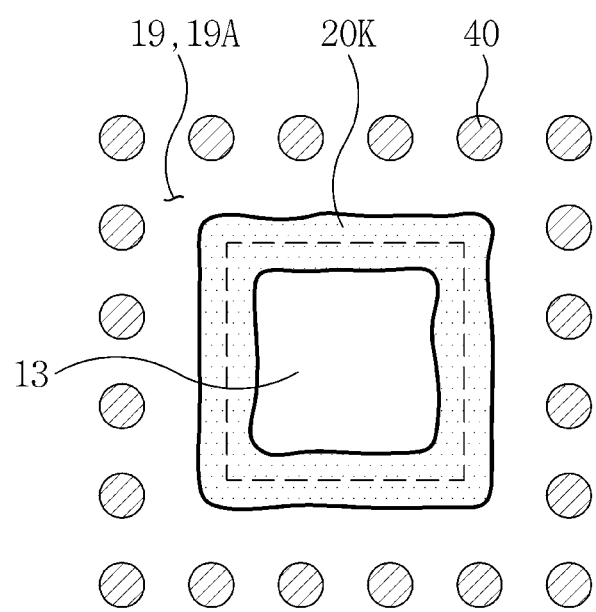

Referring to FIG. 3D, a fastening element 20K may be formed in a looped curve along a circumference or perimeter of the lower semiconductor chip 13. That is, the fastening element 20K may be disposed on the top surfaces of the lower semiconductor chip 13 and the lower molding material 19 at the perimeter of the lower semiconductor chip 13, or the fastening element 20K may be disposed on the top surface of the lower molding material 19A at portions corresponding to the perimeter of the lower semiconductor chip 13.

Figure 3E:
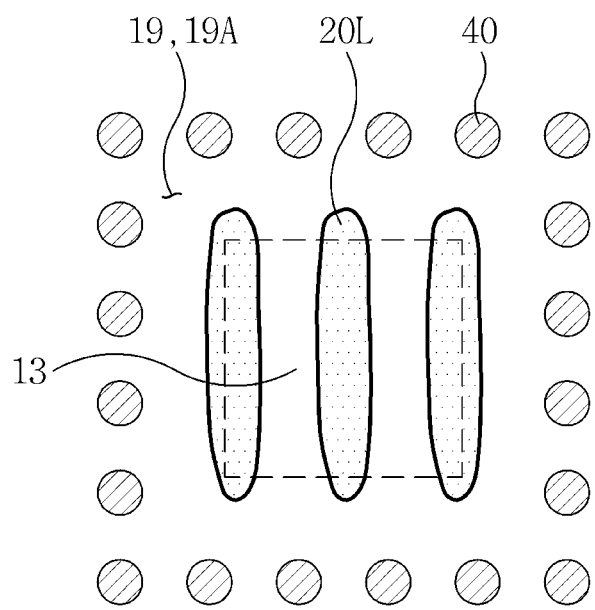

Referring to FIG. 3E, a fastening element 20L may be formed in a plurality of bar forms. That is, the fastening element 20L may be disposed on the top surfaces of the lower semiconductor chip 13 and the lower molding material 19 in one or more extended or elongated bar shapes, or the fastening element 20L may be disposed on the top surface of the lower molding material 19A at portions corresponding to the lower semiconductor chip 13 and may be disposed in one or more extended or elongated bar shapes. Although FIG. 3E shows the fastening element 20L including three extended or elongated bar shapes, aspects are not limited thereto such that the fastening element 20L may include fewer or more than three extended or elongated bar shapes, and such bar shapes may be included completely within or extend to cross a perimeter of or corresponding to the lower semiconductor chip 13 and may extend in parallel or may cross.

Figure 3F:
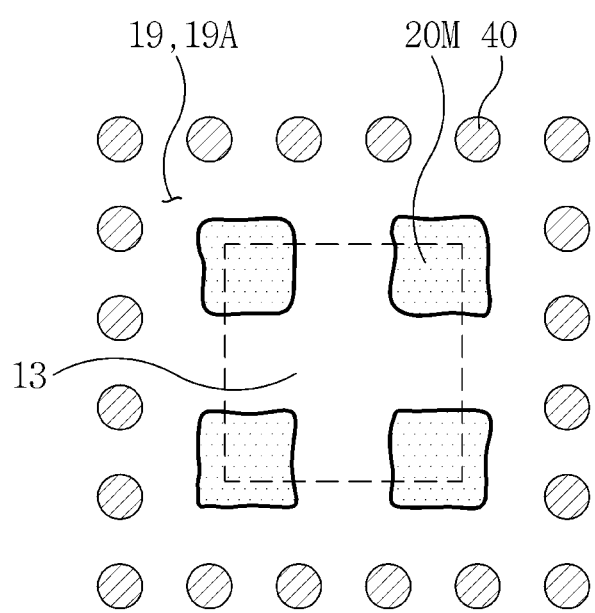

Referring to FIG. 3F, a fastening element 20M may be formed as a plurality of islands. That is, the fastening element 20M may include a number of portions disposed on top surfaces of the lower semiconductor chip 13 and/or the lower molding material 19, or the fastening element 20M may be disposed on the top surface of the lower molding material 19A at portions corresponding to the lower semiconductor chip 13. For example, the fastening element 20M may be disposed to correspond to portions of the lower semiconductor chip 13 or to correspond to the corners of the lower semiconductor chip 13; however, aspects need not be limited thereto. The various fastening elements 20H to 20M illustrated in FIGS. 3A to 3F and the features thereof may be variously modified and/or combined.

FIGS. 4A to 4G illustrate various shapes of halogen-free inter-package connectors of stack packages according to various exemplary embodiments of the present general inventive concept.

Figure 4A:
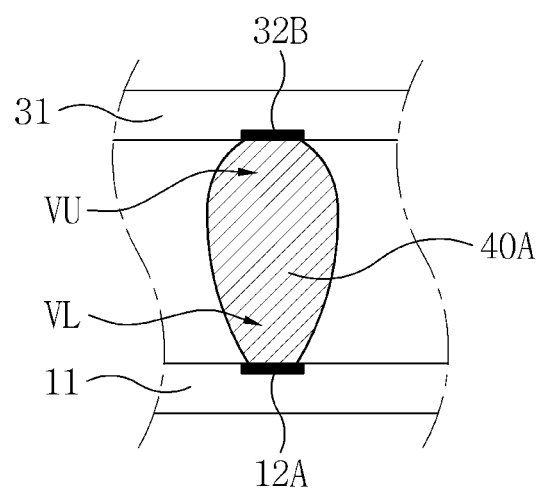
FIGS. 4A to 4G illustrate various shapes of halogen-free inter-package connectors of stack packages various exemplary embodiments of the present general inventive concept.

Referring to FIG. 4A, a halogen-free inter-package connector 40A may be formed between a lower land 12A disposed at a top surface of a lower package substrate 11 and an upper land 32B disposed on a bottom surface of an upper package substrate 31. The halogen-free inter-package connector 40A may electrically connect the lower land 12A to the upper land 32B. The halogen-free inter-package connector 40A may include a solder material. The halogen-free inter-package connector 40A may be formed to have a pot shape. For example, a volume VU of an upper part may be greater than a volume VL of a lower part. However, aspects need not be limited thereto such that the volume VU of the upper part may be less than the volume VL of the lower part. More specifically, the halogen-free inter-package connector 40A may have a cross-sectional diameter that increases from the lower land 12A to a point and then decreases to contact the upper land 32B, the largest cross-section diameter being closer to the upper land 32B than the lower land 12A. However, aspects need not be limited thereto such that the largest cross-section diameter may be closer to the lower land 12A than the upper land 32B.

Figure 4B:
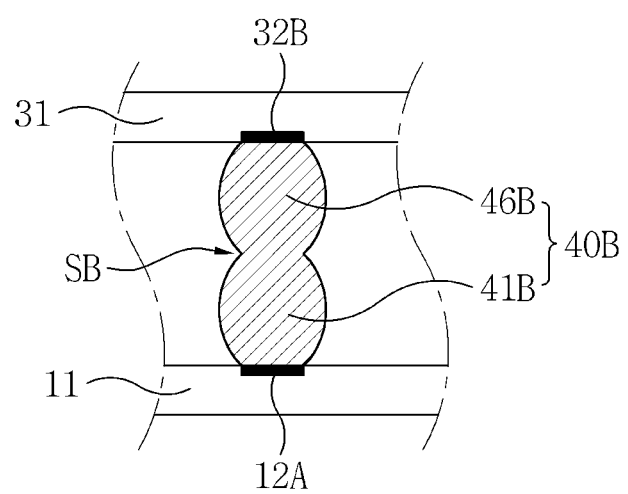

Referring to FIG. 4B, a halogen-free inter-package connector 40B may include a lower inter-package connector 41B formed on the lower package substrate 11 and an upper inter-package connector 46B formed below the upper package substrate 31. The halogen-free inter-package connector 40B may be formed, for example, in an hourglass shape. The halogen-free inter-package connector 40B may include a slender portion SB as a boundary between the lower inter-package connector 41B and the upper inter-package connector 46B. The lower inter-package connector 41B may have a volume equal to or greater than the upper inter-package connector 46B. The lower inter-package connector 41B and the upper inter-package connector 46B may include a solder material. As shown in FIG. 4B, each of the lower inter-package connector 41B and the upper inter-package connector 46B is illustrated as having a ball or spherical shape, but aspects are not limited thereto, for example, at least one of the lower inter-package connector 41B and the upper inter-package connector 46B may have a pillar shape.

Figure 4C:
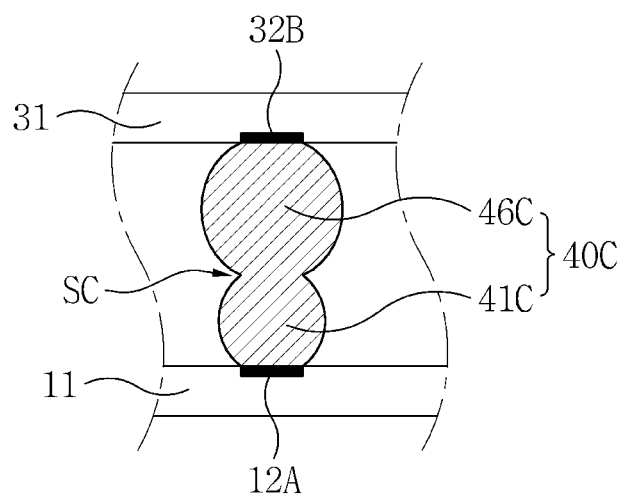

Referring to FIG. 4C, a halogen-free inter-package connector 40C may include a lower inter-package connector 41C having a relatively small volume and an upper inter-package connector 46C having a relatively large volume. The halogen-free inter-package connector 40C may be formed in an hour-glass shape. That is, the halogen-free inter-package connector 40C may include a slender portion SC disposed between the lower inter-package connector 41C and the upper inter-package connector 46C. Since the upper inter-package connector 46C may have a greater volume than the lower inter-package connector 41C, the halogen-free inter-package connector 40C may decrease the distance between the lower lands 12A, in particular, if a plurality of lower lands 12A are disposed on the lower package substrate 11, so that the halogen-free inter-package connectors 40C and the lower lands 12A may be disposed at fine pitches.

Figure 4D:
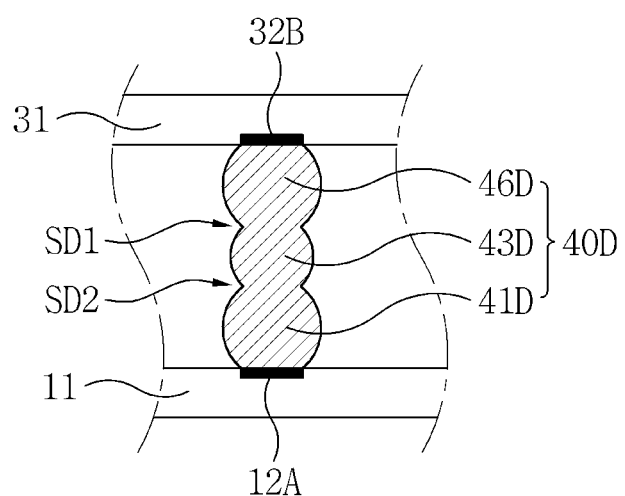

Referring to FIG. 4D, a halogen-free inter-package connector 40D may include a lower inter-package connector 41D, an intermediate inter-package connector 43D, and an upper inter-package connector 46D. A slender portion SD1 may be formed between the lower inter-package connectors 41D and the intermediate inter-package connector 43D. A slender portion SD2 may be formed between the intermediate inter-package connector 43D and the upper inter-package connector 46D. The intermediate inter-package connector 43D may have a smallest volume from among the lower inter-package connector 41D, the intermediate inter-package connector 43D, and the upper inter-package connector 46D. The intermediate inter-package connector 43D may include a solder material. The intermediate inter-package connector 43D may contain an extremely small amount of halogen equal to or lower than the international environmental standard. Various environmental standards with respect to the halogen content include a Resin-to-Resin Transfer Reaction (RRTR) in Japan, and the Waste Electrical and Electronic Equipment Directive (WEEE) & Restriction of Hazardous Substances Directive (RoHS) in Europe. Halogen-free standards according to IEC61249 define no more than 900 ppm of bromine and chlorine and no more than a total of 1500 ppm of halogen content. The intermediate inter-package connector 43D may comply with this standard.

Figure 4E:
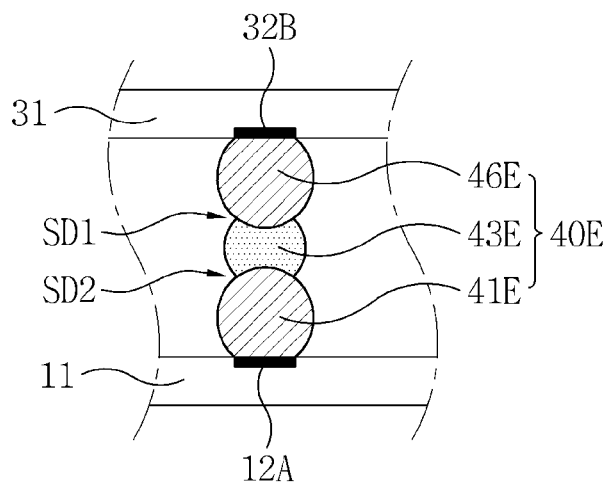

Referring to FIG. 4E, a halogen-free inter-package connector 40E may include a lower inter-package connector 41E including a solder material, an upper inter-package connector 46E, and an intermediate inter-package connector 43E including a conductive adhesive material. The upper inter-package connector 46E may include a solder material. The intermediate inter-package connector 43E may include a conductive filler or particle, a resin, and a volatile solvent. Specifically, the intermediate inter-package connector 43E may include a conductive filler or particle, such as metal balls or metal coated balls. The intermediate inter-package connector 43E may include a rosin resin, an organic polymer resin, or an inorganic resin, such as an epoxy resin. The volatile solvent may include solvent or isopropyl alcohol. For example, the intermediate inter-package connector 43E may include an anisotropic conductive paste. The lower inter-package connector 41E, the intermediate inter-package connector 43E, and the upper inter-package connector 46E of the halogen-free inter-package connector 40E may include slender portions SD1 and SD2 formed between the lower inter-package connectors 41E and the intermediate inter-package connector 43E and between the intermediate inter-package connector 43E and the upper inter-package connector 46E, respectively. The intermediate inter-package connector 43E may have a smallest volume from among the lower inter-package connector 41E, the intermediate inter-package connector 43E, and the upper inter-package connector 46E.

Figure 4F:
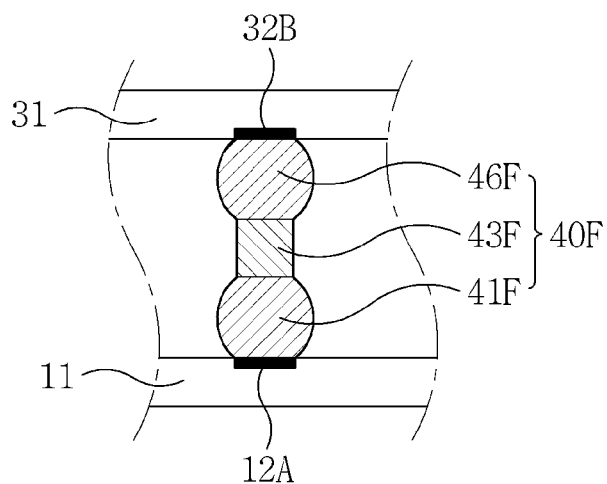

Referring to FIG. 4F, a halogen-free inter-package connector 40F may include a lower inter-package connector 41F including a solder material, an upper inter-package connector 46F, and a metallic intermediate inter-package connector 43F. The metallic intermediate inter-package connector 43F may be in the shape of a pillar, disk, or pad, and may have a cross-sectional diameter smaller than at least one of the largest cross-sectional diameters of the lower inter-package connector 41F and the upper inter-package connector 46F; however, aspects need not be limited thereto such that the cross-sectional diameter of metallic intermediate inter-package connector 43F may be equal to or greater than at least one of the largest cross-sectional diameters of the lower inter-package connector 41F and the upper inter-package connector 46F. The upper inter-package connector 46F may include a solder material.

Figure 4G:
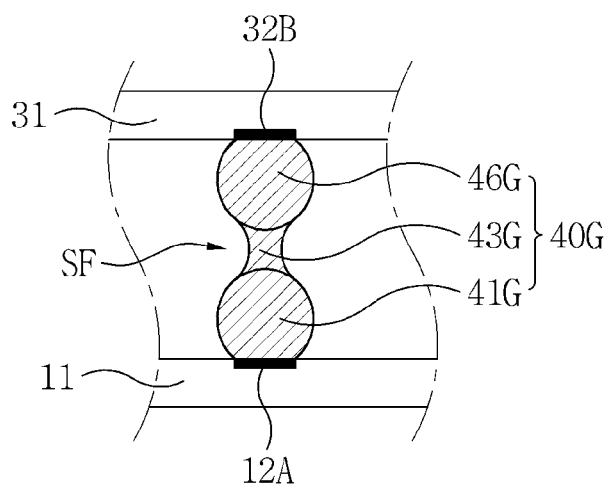

Referring to FIG. 4G, a halogen-free inter-package connector 40G may include a lower inter-package connector 41G, an upper inter-package connector 46G, and a bridge-type intermediate inter-package connector 43G. The bridge-type intermediate inter-package connector 43G may be formed of a material identical or similar to one of the intermediate inter-package connectors 43D and 43E illustrated in FIG. 4D or 4E. The bridge-type intermediate inter-package connector 43G may be formed of a material containing isopropyl alcohol, etc. For example, the bridge-type intermediate inter-package connector 43G may be formed by removing isopropyl alcohol from a conductive paste containing a conductive filler or particle, a resin, and isopropyl alcohol. Isopropyl alcohol may be replaced by a solvent. The resin may include a rosin resin, an epoxy resin, or other various synthetic resins. When isopropyl alcohol is removed, volume is reduced, and thus the intermediate inter-package connector 43G may be formed in the shape of a bridge having a middle portion that is narrower than the end portions thereof.

FIGS. 5A to 5F illustrate a method of fabricating stack packages according to exemplary embodiments of the present general inventive concept.

Figure 5A:
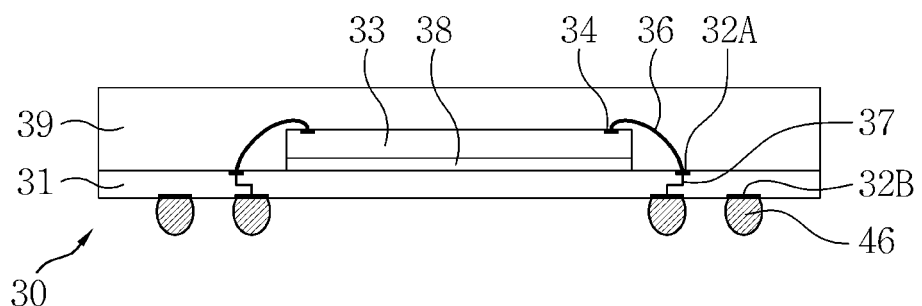
FIGS. 5A to 5F illustrate a method of fabricating stack packages according to various exemplary embodiments of the present general inventive concept.

Referring to FIG. 5A, a method of fabricating stack packages include completing an upper package 30. The completed upper package 30 may be understood as one of the upper packages 30A to 30G according to various exemplary embodiments as illustrated in FIGS. 1A to 1G. The upper package 30A illustrated in FIG. 1A is illustrated. An upper inter-package connector 46 may be omitted.

Figure 5B:
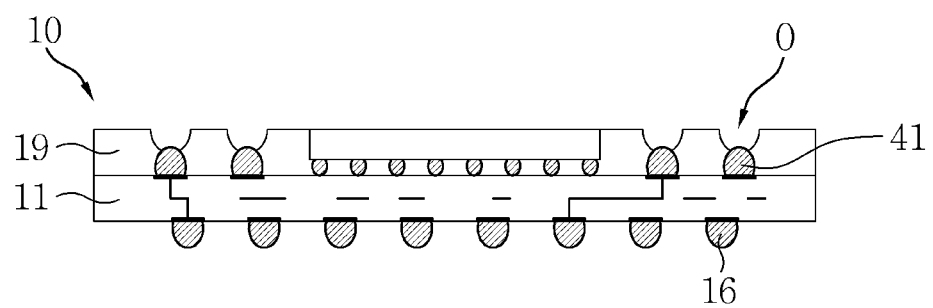

Referring to FIG. 5B, a method of fabricating stack packages may include completing a lower package 10 in which a lower molding material is formed 19 having an inter-package connector opening O that expose a top surface of a lower inter-package connector 41. The completed lower package 10 may include any of the features or any combinations thereof as described herein and illustrated in the drawings. Board connection solders 16 may be omitted.

Figure 5C:
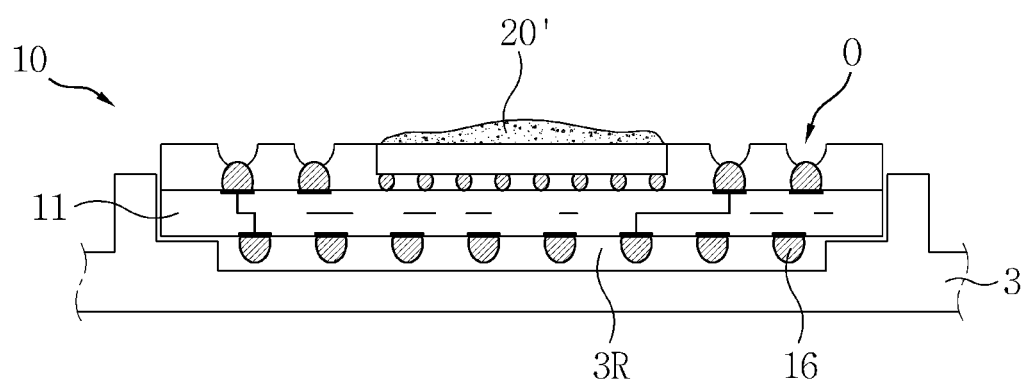

Referring to FIG. 5C, a method of fabricating stack packages may include placing the completed lower package 10 on a lower stack boat 3. The lower stack boat 3 may be in contact with an outer circumference or perimeter and/or a bottom surface of a lower package substrate 11. The lower stack boat 3 may include a recessed portion 3R in which board connection solders 16 are positioned. A fastening element 20' that is provided on the exposed top surface of a lower semiconductor chip 13 and is not hardened may be included. The fastening element 20' that is not hardened may be in the form of a liquid or paste having a viscosity. The fastening element 20' that is not hardened may be provided by dispensing, pasting, or spraying. The fastening element 20' that is not hardened may include a thermosetting resin having adhesive properties. For example, the fastening element 20' that is not hardened may include an epoxy resin, and may further include solvent or isopropyl alcohol.

Figure 5D:
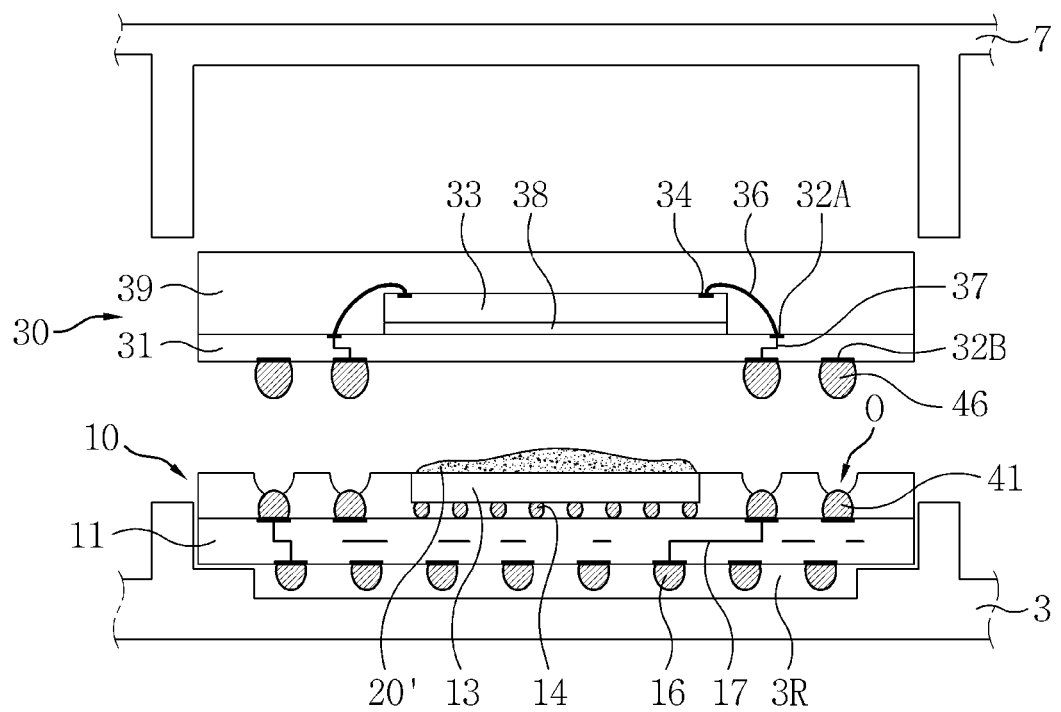

Referring to FIG. 5D, a method of fabricating stack packages may include placing the upper package 30 on the lower package 10. During or afterwards, an upper stack boat 7 may cover the upper package 30.

Figure 5E:
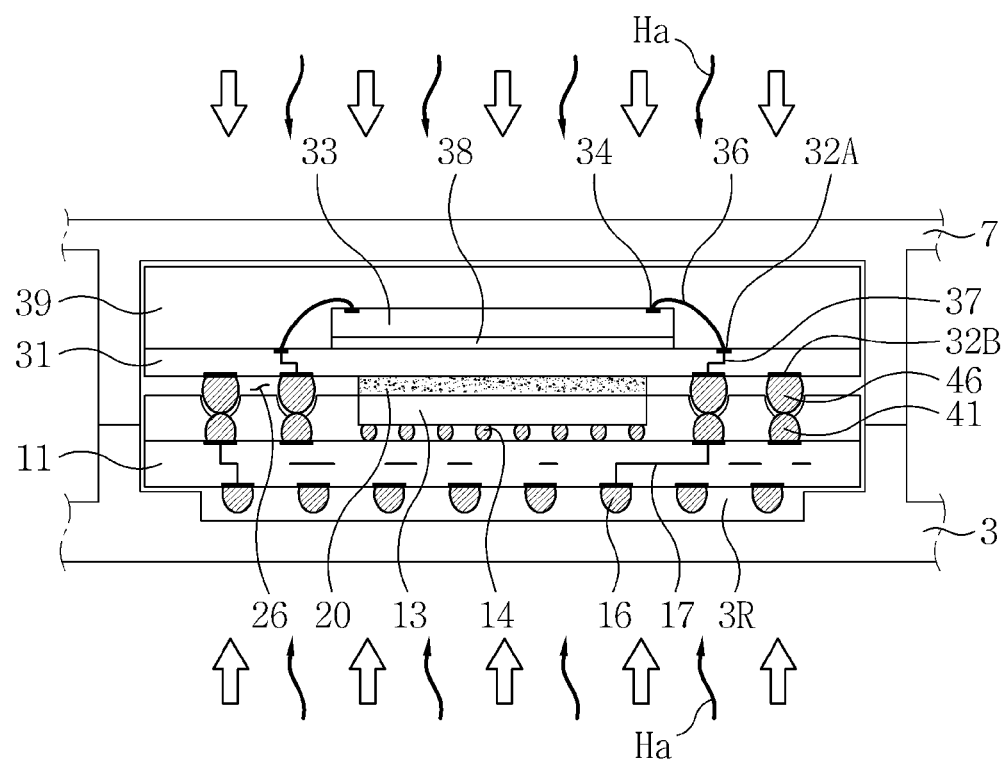

Referring to FIG. 5E, a method of fabricating stack packages may include performing a first annealing process of heating Ha and hardening or curing the fastening element 20'. The first annealing process may include heating Ha the fastening element 20' at a temperature of 125° C. to 175° C. The first annealing process may be performed for 5 to 120 minutes. During the first annealing process, a pressure may be applied to the lower stack boat 3 and the upper stack boat 7 as indicated by the arrows, i.e., pressure may be applied to compress the lower stack boat 3 and the upper stack boat 7 together. An air space 26 may exist between a fastening element 20 that is hardened and the upper inter-package connector 46. When a process in which a flux having a halogen element is used, most or all volatile ingredients of the flux may be vaporized during this process. Therefore, since an oxide layer on surfaces of the lower and upper inter-package connectors 41 and 46 is not removed during the subsequent solder reflow process, the connectors may not be appropriately integrated. Therefore, stack packages fabricated according to the features and utilities of the present general inventive concept may include a halogen-free inter-package connector.

Figure 5F:
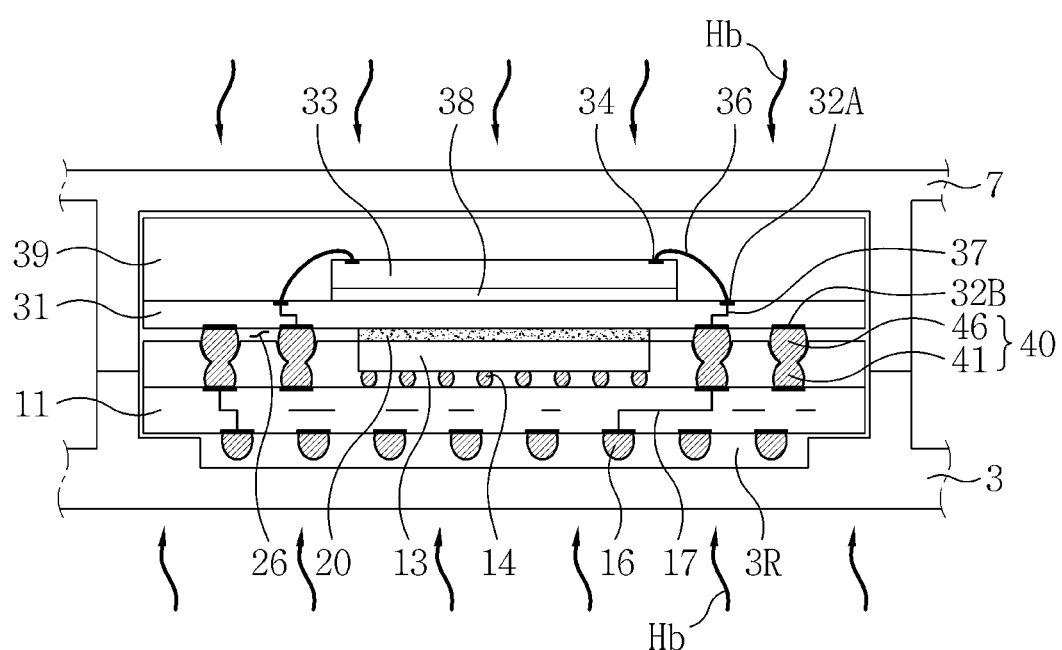

Referring to FIG. 5F, a method of fabricating stack packages may include performing a second annealing process for integrating or connecting the lower inter-package connector 41 with the upper inter-package connector 46. The second annealing process may include heating Hb the upper inter-package connector 46 and the lower inter-package connector 41 at a temperature range of 230° C. and 250° C. in a gas atmosphere including hydrogen. More specifically, the second annealing process may include heating Hb the lower inter-package connector 41 and the upper inter-package connector 46 at a temperature range of 235° C. and 245° C. in a hydrogen and/or formic (or methanoic) acid (HCOOH) gas atmosphere.

Hydrogen or HCOOH gas washes surfaces of the lower inter-package connector 41 and the upper inter-package connector 46 to accelerate reflow. That is, oxide may be removed from the surfaces of the lower inter-package connector 41 and the upper inter-package connector 46 without using halogen group elements, and thus integration or connection of the lower inter-package connector 41 with the upper inter-package connector 46 may be accelerated. That is, the second annealing process may be a type of a solder joint process or include a solder joint process. When surface pollution of the lower inter-package connector 41 and the upper inter-package connector 46 is not cleaned, the likelihood of the integration of the lower inter-package connector 41 with the upper inter-package connector 46 is decreased, and even if the lower inter-package connector 41 and the upper inter-package connector 46 are integrated with each other, sufficient electrical conductivity may not be ensured. Therefore, the surfaces of the lower inter-package connector 41 and the upper inter-package connector 46 are cleaned.

The processes of cleaning surfaces of solders using a halogen group element may include immersing the solders in a liquid-phase surfactant containing a halogen group element. Alternatively, the processes may include contacting a vapor-phase surfactant with the surfaces of the solders. A solder flux may be a surfactant containing a halogen group element. Cleaning the surfaces of the solders using hydrogen or HCOOH gas may exhibit deteriorated cleaning abilities compared with cleaning the surfaces of the solders using the halogen group element. That is, the solder joint process of reflowing solders and integrating them exhibits insufficient efficiency. Therefore, the temperature of the second annealing process, i.e., the temperature of the solder joint process using hydrogen or HCOOH gas may be higher than that of the solder joint process using the halogen group element. When the surfaces of the solders are cleaned using the halogen group element, the solder joint process is performed at a temperature lower than the temperature range of the second annealing process. For example, the solder joint process may be performed at a temperature below 230° C. When the temperature of the second annealing process is increased, the likelihood of thermal deformation of the lower package substrate 11 or the upper package substrate 31 is increased. For example, probability of distortion or warpage of the substrate may increase. When the lower package substrate 11 or the upper package substrate 31 is distorted, the process of integrating the lower inter-package connector 41 with the upper inter-package connector 46 may be unstable. For example, they may not be sufficiently integrated. That is, solder joint reliability (SJR) may be degraded. However, existence of the fastening element 20 according to various exemplary embodiments of the present general inventive concept may alleviate distortion or warpage of the lower package substrate 11 and/or the upper package substrate 31. That is, degraded reliability of the solder joint caused by heat stress of the solder joint process may be decreased, and productivity may be increased. Therefore, the features and utilities of the present general inventive concept provide environment-friendly stack packages having excellent solder joint reliability.

A cooling process may be added between the first and second annealing processes. The cooling process may include storing the stack package 100 at room temperature for several minutes to several hours.

The stack packages 100A to 100G according to various exemplary embodiments illustrated in FIGS. 1A to 1G may be completed by performing the above processes.

Figure 6A:
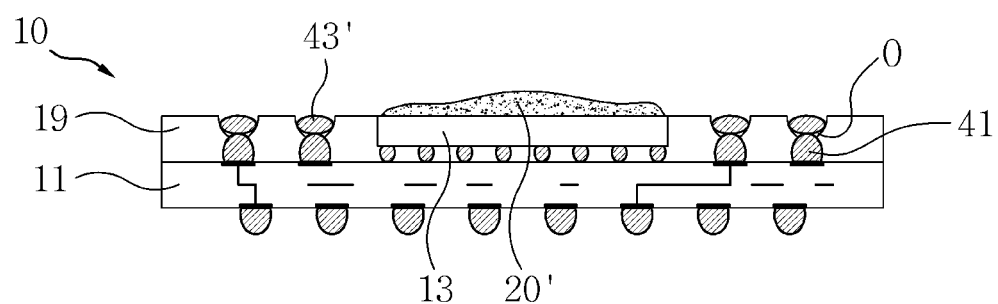
FIGS. 6A to 8C illustrate a method of fabricating stack packages according to various exemplary embodiments of the present general inventive concept.

FIGS. 6A to 6D illustrate a method of fabricating a stack package according to exemplary embodiments of the present general inventive concept. Referring to FIG. 6A, a method of fabricating a stack package may include providing a fastening element 20', which is not hardened, on a top surface of the lower semiconductor chip 13 of the completed lower package 10 after completing the upper package 30 and the lower package 10 illustrated in FIGS. 5A and 5B, and providing an intermediate inter-package connector 43' including a solder material on the lower inter-package connector 41 exposed within an inter-package connector opening O. The intermediate inter-package connector 43' may further include isopropyl alcohol. The intermediate inter-package connector 43' may be in a variable solid state, such as a paste or gel.

Figure 6B:
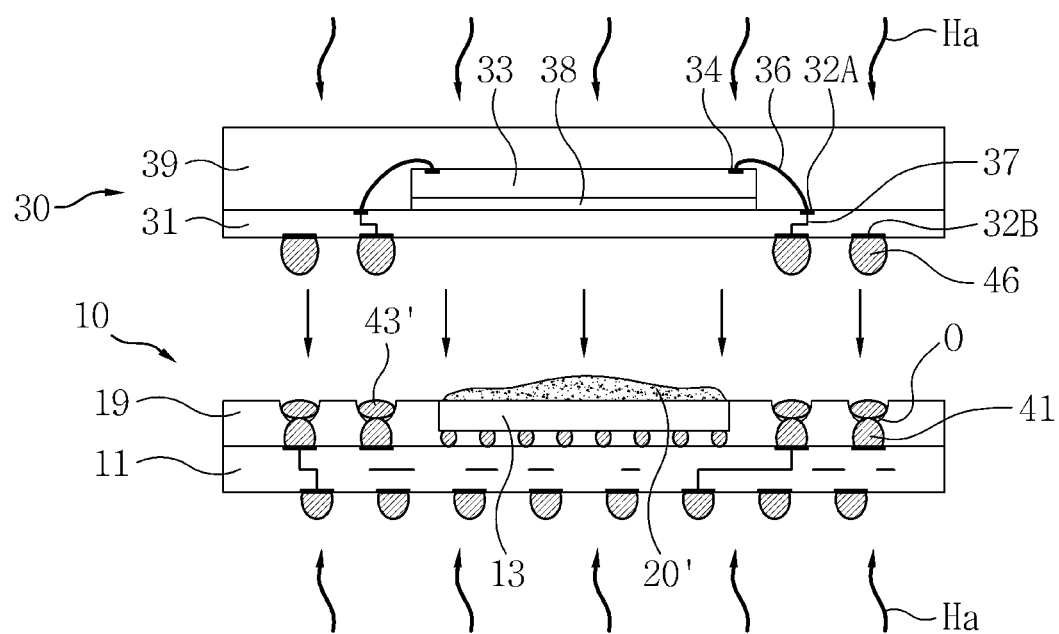

Referring to FIG. 6B, a method of fabricating a stack package may include arranging the upper package 30 including an upper inter-package connector 46 on the lower package 10, and performing a first annealing process of heating Ha the fastening element 20'. The first annealing process may be understood in detail with reference to FIG. 5E. The lower stack boat 3 and the upper stack boat 7 illustrated in FIGS. 5C and 5F are omitted.

Figure 6C:
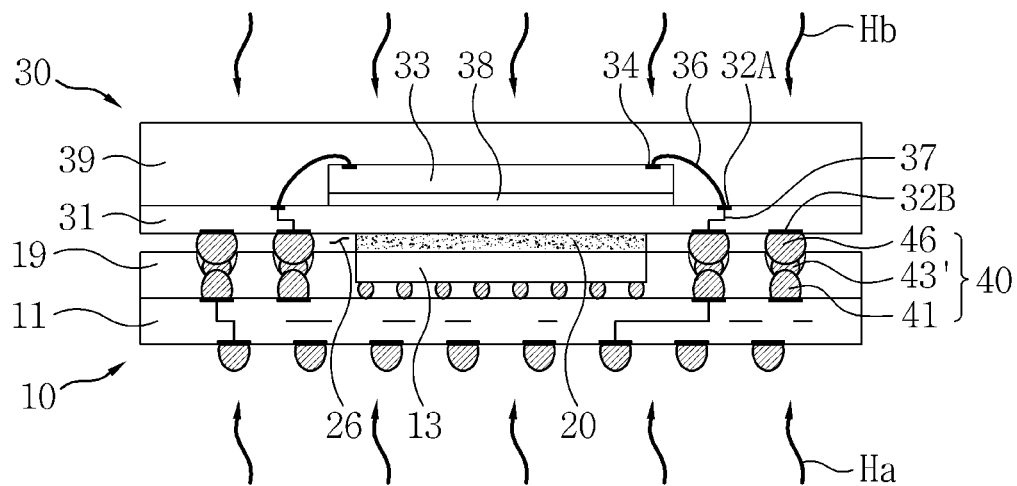

Referring to FIG. 6C, a method of fabricating a stack package include a process of hardening the intermediate inter-package connector 43' including a solder material by performing a second annealing process. In the drawing, the intermediate inter-package connector 43', which is not yet hardened, is illustrated. Specifically, the lower inter-package connector 41, the intermediate inter-package connector 43' and the upper inter-package connector 46 may view as each component, which are not integrated.

Figure 6D:
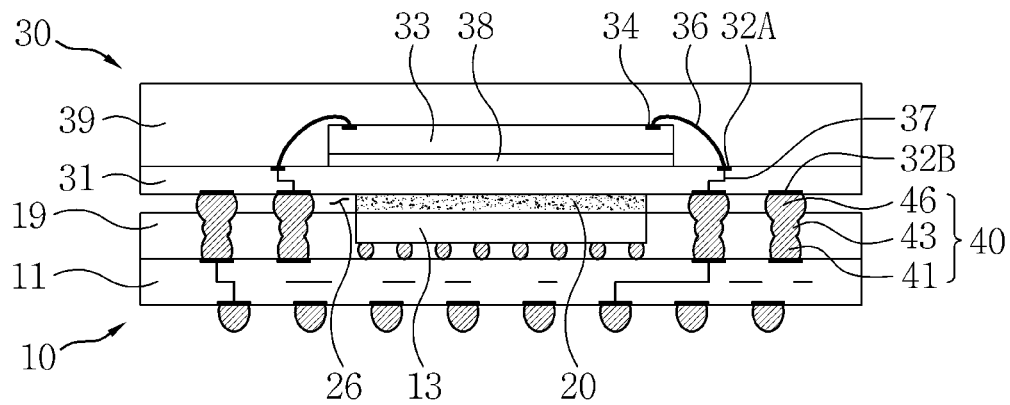

Referring to FIG. 6D, as a result of the second annealing process, an inter-package connector 40 in which the lower inter-package connector 41, the intermediate inter-package connector 43, and the upper inter-package connector 46 are integrated may be formed.

As the intermediate inter-package connector 43' includes a large amount of a volatile solvent, the completed intermediate inter-package connector 43 exhibits reduced volume, so that its middle may be slender. For example, the completed intermediate inter-package connector 43 may be formed as illustrated in FIG. 4G.

Figure 7A:
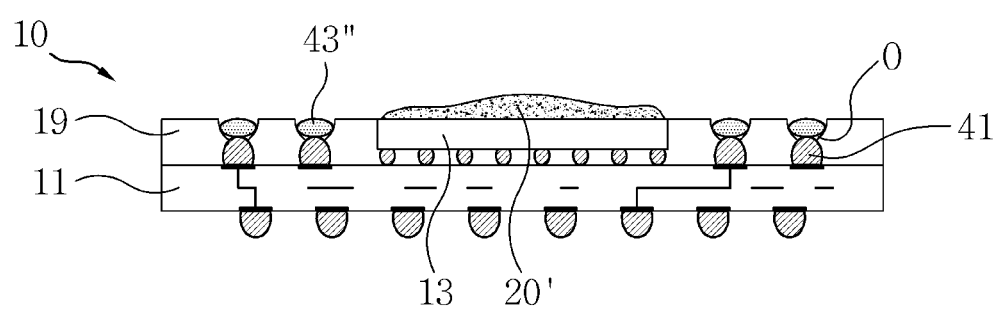
Figure 7B:
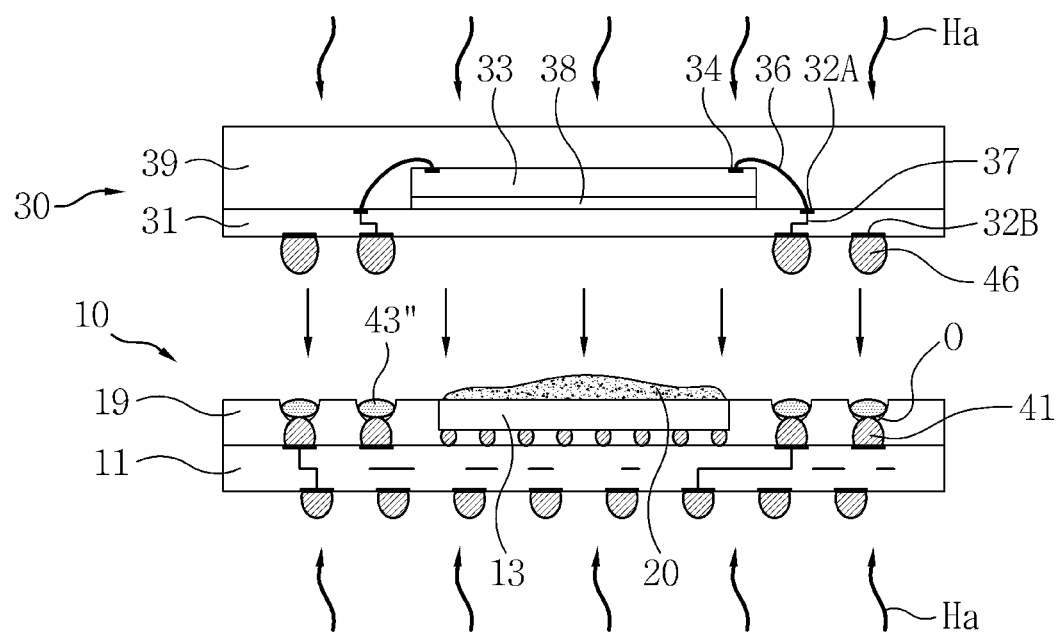
Figure 7C:
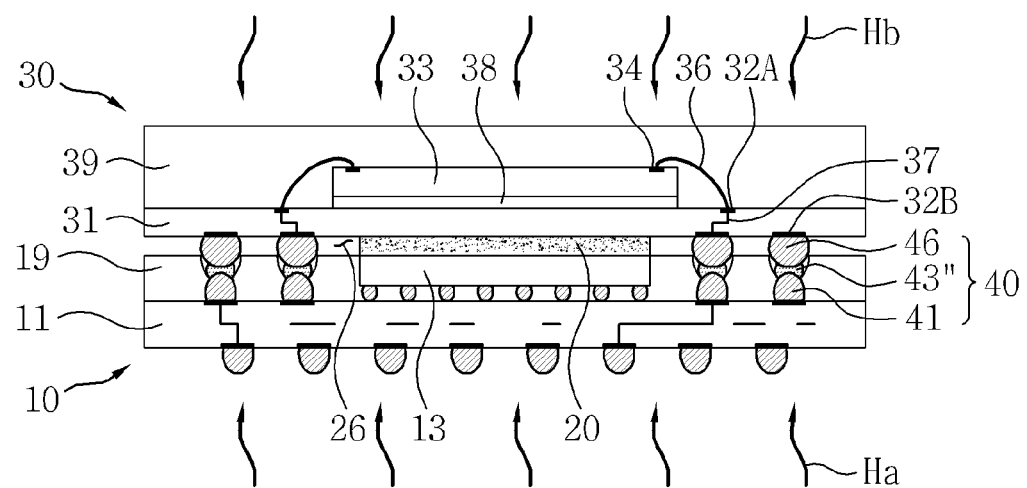

FIGS. 7A to 7C illustrate a method of fabricating stack packages according to exemplary embodiments of the present general inventive concept. Referring to FIG. 7A, in a method of fabricating stack packages, the upper package 30 and the lower package 10 illustrated in FIGS. 5A and 5B are completed, a fastening element 20', which is not hardened, may be provided on a top surface of the lower semiconductor chip 13 of the completed lower package 10, and an intermediate inter-package connector 43", which is not hardened, may be provided on the lower inter-package connector 41 exposed within an inter-package connector opening O. The intermediate inter-package connector 43", which is not hardened, may include the intermediate inter-package connector 43E described in FIG. 4E. The intermediate inter-package connector 43", which is not hardened, may be in the state of a paste or gel.

Referring to FIG. 7B, a method of fabricating stack packages may include arranging the upper package 30 including an upper inter-package connector 46 on the lower package 10, and performing a first annealing process of heating Ha the fastening element 20' and the intermediate inter-package connector 43". During this process, a solvent ingredient contained in the fastening element 20', which is not hardened, may be removed. For example, solvent or isopropyl alcohol may be removed. Since the intermediate inter-package connector 43' does not include a solder material, a high-temperature heating process may be omitted.

Referring to FIG. 7C, a method of fabricating stack packages may include hardening the intermediate inter-package connector 43" by the first annealing process. A second annealing process of further hardening the intermediate inter-package connector 43" may be performed. The second annealing process may include heating the intermediate inter-package connector 43" at a higher temperature than the first annealing process. The method of fabricating stack packages according to the inventive concept may be understood with reference to FIG. 4E.

Figure 8A:
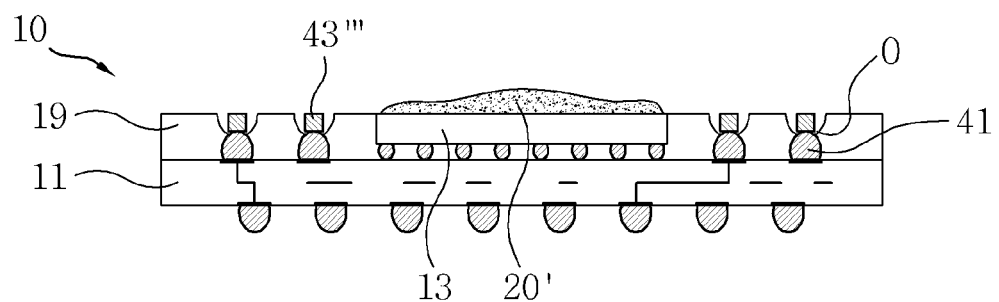
Figure 8B:
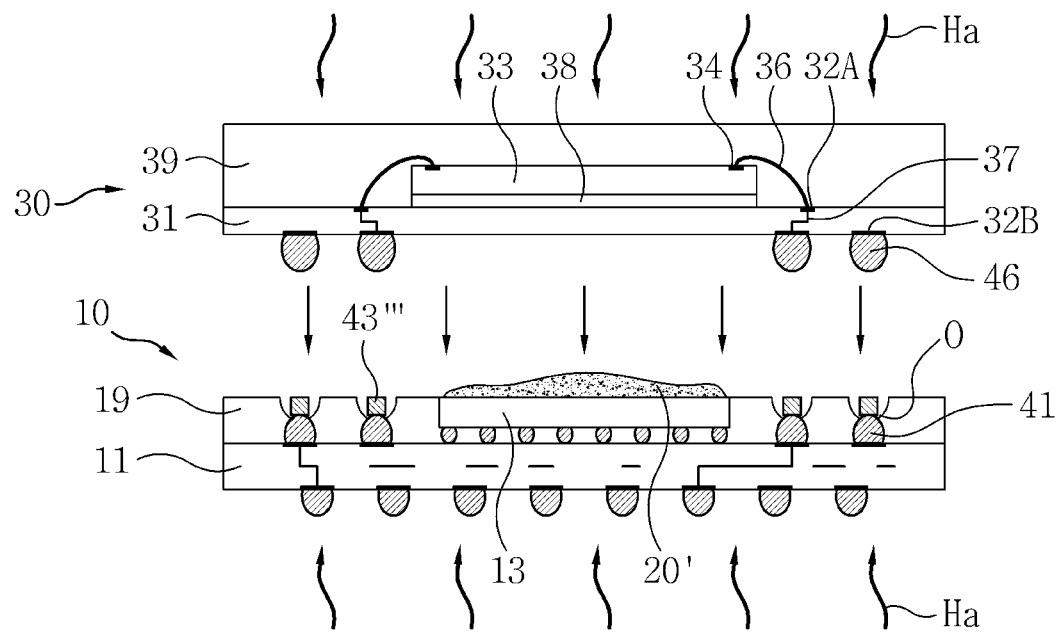
Figure 8C:
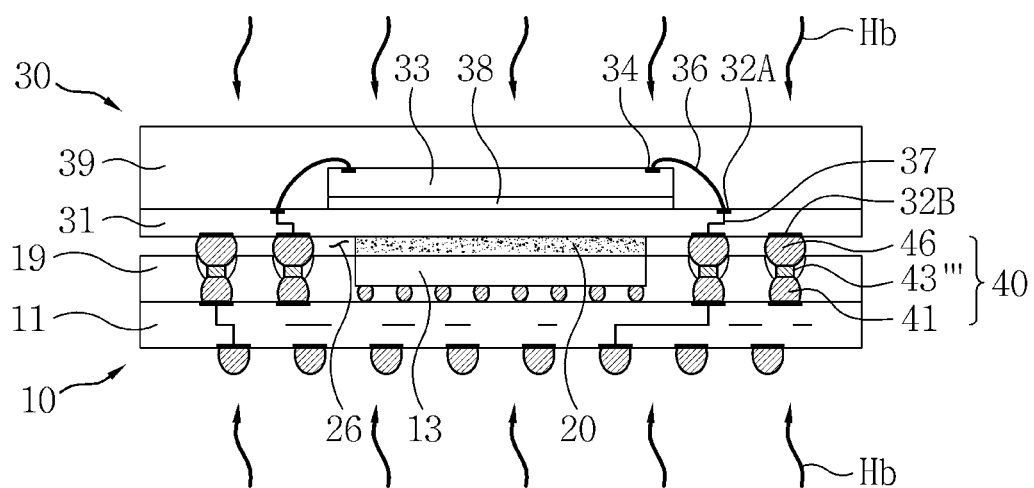

FIGS. 8A to 8C illustrate a method of fabricating stack packages according to exemplary embodiments of the present general inventive concept. Referring to FIG. 8A, a method of fabricating stack packages may include providing a fastening element 20', which is not hardened, on a top surface of the lower semiconductor chip 13 of the completed lower package 10 after completing the upper package 30 and the lower package 10 illustrated in FIGS. 5A and 5B, and providing an intermediate inter-package connector 43''' including a metal on the lower inter-package connector 41 exposed within an inter-package connector opening O. The intermediate inter-package connector 43''' may be in the shape of a pillar, disk, or pad.

Referring to FIG. 8B, a method of fabricating stack packages may include arranging the upper package 30 including the upper inter-package connector 46 on the lower package 10, and performing a first annealing process of heating Ha the fastening element 20'. During this process, the fastening element 20' may be hardened.

Referring to FIG. 8C, a method of fabricating stack packages may include performing a second annealing process of electrically and physically connecting a lower inter-package connector 41, an intermediate inter-package connector 43''', and an upper inter-package connector 46. The second annealing process may include heating the lower inter-package connector 41 and the upper inter-package connector 46 at a temperature of about 200° C. or higher. The heating process may be performed in a hydrogen or HCOOH gas atmosphere. Alternatively, the heating process may be performed in the atmosphere. The embodiment may be further understood with reference to FIG. 4G.

Figure 9:
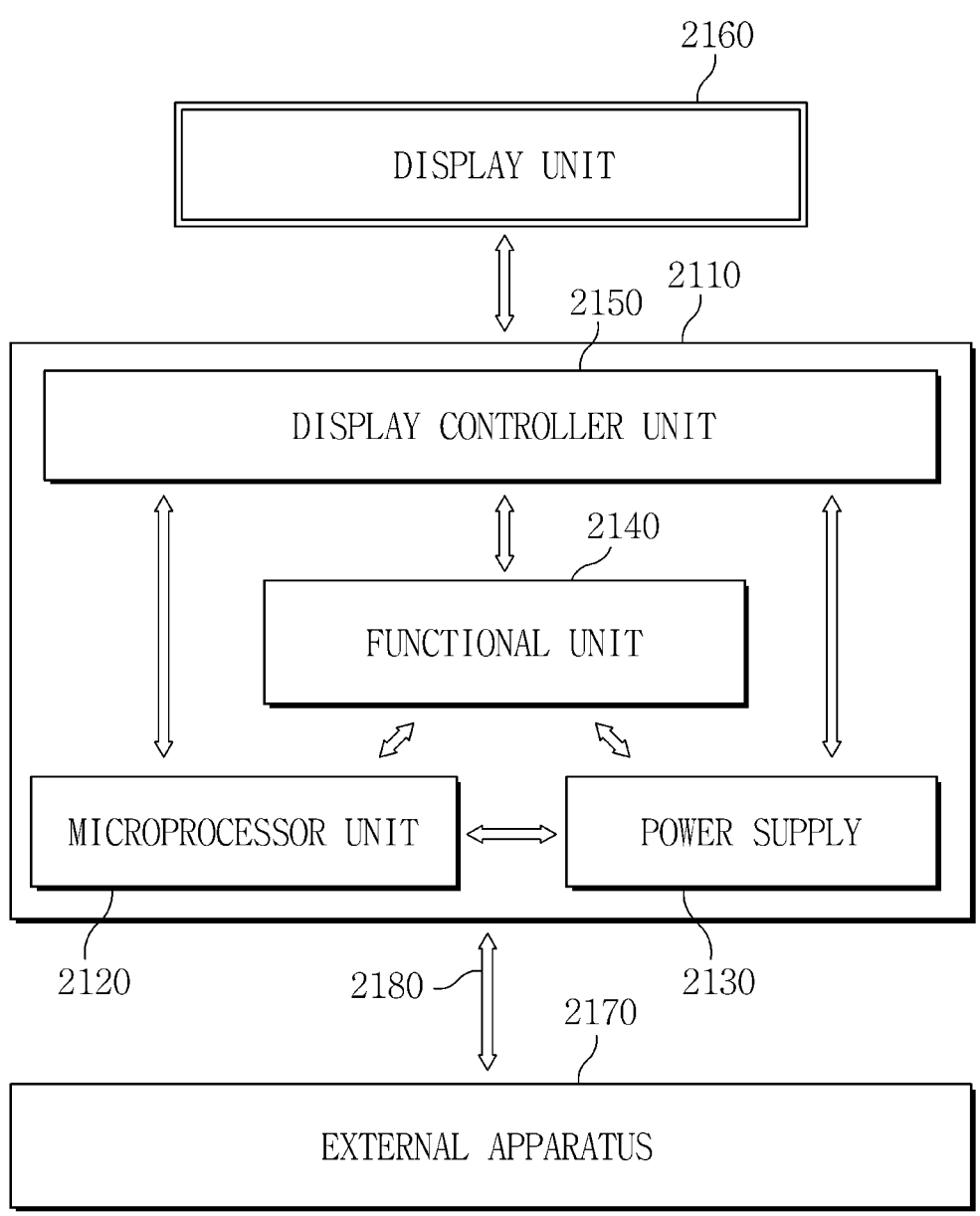
FIG. 9 is a block diagram of an electronic system according to various exemplary embodiments of the present general inventive concept.

FIG. 9 is a block diagram of an electronic system according to exemplary embodiments of the present general inventive concept. Referring to FIG. 9, various stack packages according to exemplary embodiments of the present general inventive concept may be applied to an electronic system 2100. The electronic system 2100 may include a body 2110, a microprocessor unit 2120, a power supply 2130, a functional unit 2140, and/or a display controller unit 2150. The body 2110 may be a system board or main board formed of a printed circuit board (PCB). The microprocessor unit 2120, the power supply 2130, the functional unit 2140, and the display controller unit 2150 may be installed or mounted on the body 2110. A display unit 2160 may be disposed on a top surface of the body 2110 or on the body 2110. For example, the display unit 2160 may be disposed on a surface of the body 2110 to display an image processed by the display controller unit 2150.

The power supply 2130 is supplied with a predetermined voltage from an external battery, divides the voltage into a required voltage level, and supplies the divided voltage to the microprocessor unit 2120, the functional unit 2140 and the display controller unit 2150. The microprocessor unit 2120 may be supplied with a voltage from the power supply 2130 to control the functional unit 2140 and the display unit 2160. The functional unit 2140 may perform various functions of the electronic system 2100. For example, when the electronic device 2100 is a mobile electronic appliance, such as a cellular phone, the functional unit 2140 may include various components capable of functioning as a cellular phone function including outputting an image on the display unit 2160 and outputting voice through a speaker by dialing or communication with an external apparatus 2170. Furthermore, when the external apparatus 2170 includes a camera, the functional unit 2140 may function as an image processor.

In other applied embodiments, when the electronic system 2100 may be connected to a memory card for capacity expansion, the functional unit 2140 may be a memory card controller. The functional unit 2140 may transmit/receive a signal to/from the external apparatus 2170 via a wired or wireless communication unit 2180. Moreover, when the electronic system 2100 requires a universal serial bus (USB) for function expansion, the functional unit 2140 may function as an interface controller.

The stack packages described in various embodiments according to the inventive concept may be included in at least one of the microprocessor unit 2120, power supply 2130, the functional unit 2140, and the display controller unit 2150.

According to various exemplary embodiments of the present general inventive concept, a fastening element and an air space can be formed between an upper package and a lower package. A halogen-free inter-package connector can be formed between the upper package and the lower package. Features and utilities of the present general inventive concept provide environment-friendly electronic products. Features and utilities of the present general inventive concept improves reliability of a solder joint. Features and utilities of the present general inventive concept can implement a thinner stack package. According features and utilities of the present general inventive concept, a process that does not require a flux is provided. For example, in lieu of a flux that is used for removing an oxide layer on surface of solder balls, hydrogen or a gas containing hydrogen is used, or a process that does not require a solder reflow process or requires minimum use of a flux is suggested. Since the flux includes a halogen element for removing the oxide layer, it is a material that has a negative effect on the environment. The inventive features and utilities of the present general concept provides an eco-friendly process of fabricating a semiconductor package The components whose reference numerals are not indicated, or components with only reference numerals indicated may be easily understood with reference to the names and functions in the other drawings and descriptions thereof in the specification. Also, only representative exemplary embodiments are described in a limited manner in the specification, it will be fully understood that any feature in any exemplary embodiment may be modified, combined, and/or implemented in any other exemplary embodiment.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a stack package, the method comprising:
    forming a lower package comprising a lower package substrate, a first lower land disposed on a top surface of the lower package substrate, a lower inter-package connector disposed on the first lower land, and a lower semiconductor chip disposed on the top surface of the lower package substrate;
    forming an upper package comprising an upper package substrate, a first upper land disposed on a bottom surface of the upper package substrate, an upper inter-package connector disposed on the first upper land, and an upper semiconductor chip disposed on a top surface of the upper package substrate;
    providing an intermediate inter-package connector disposed on at least one of the lower inter-package connector and the upper inter-package connector;
    providing a fastening element between the lower package and the upper package;
    performing a first annealing to cure the fastening element; and
    performing a second annealing to integrate the lower inter-package connector, the intermediate inter-package connector, and the upper inter-package connector,
    wherein at least one of the first annealing and the second annealing removes at least one of an alcohol or a solvent from the intermediate inter-package connector to decrease a volume thereof.

2. The method of claim 1, wherein the second annealing is performed at a higher temperature than the first annealing.

3. The method of claim 1, wherein the lower inter-package connector and the upper inter-package connector each comprise tin, silver, and copper, and are substantially free of halogen-group elements.

4. The method of claim 1, wherein the intermediate inter-package connector comprises an amount of halogen group elements no more than 1500 ppm.

5. The method of claim 4, wherein the intermediate inter-package connector comprises no more than 900 ppm of bromine and chlorine.

6. The method of claim 1, wherein the second annealing is performed at a temperature range of 230° C. to 250° C.

7. The method of claim 1, wherein the second annealing is performed under a hydrogen and/or formic acid atmosphere.

8. The method of claim 1, wherein the first annealing is performed at a temperature range of 125° C. to 175° C.

9. A method of manufacturing a stack package, the method comprising:
    preparing an upper package in which an upper semiconductor chip and an upper inter-package connector are disposed on opposite surfaces of an upper package substrate;
    preparing a lower package in which a lower semiconductor chip and a lower inter-package connector are disposed on a same surface of a lower package substrate and a molding material contacts side surfaces of the lower semiconductor chip and contacts side surfaces of the lower inter-package connector, the molding material including an opening to expose a top surface of the lower inter-package connector;
    providing a fastening element between a top surface of the lower semiconductor chip and a bottom surface of the upper package substrate; and
    performing a first annealing to cure the fastening element and remove flux having a halogen element from the upper inter-package connector and the lower inter-package connector; and
    performing a second annealing to integrate the upper inter-package connector and the lower inter-package connector,
    wherein the first annealing is performed in a gas atmosphere containing hydrogen.

10. The method of claim 9, wherein the second annealing heats the upper inter-package connector and the lower inter-package connector in a gas atmosphere containing hydrogen.

11. The method of claim 10, wherein the gas containing hydrogen comprises hydrogen gas and/or formic acid gas.

12. The method of claim 10, wherein the second annealing is performed at a temperature of 230 to 245° C.

13. The method of claim 9, further comprising:
    inserting the upper inter-package connector into the opening to connect the upper and lower inter-package connectors.

14. A method of manufacturing a stack package, the method comprising:
    preparing an upper package comprising:
        an upper package substrate,
        a first upper land and a upper semiconductor chip disposed on a top surface of the upper package substrate,
        a second upper land disposed on a bottom surface of the upper package substrate, and
        an upper inter-package connector disposed on the second upper land;
    preparing a lower package comprising:
        a lower package substrate,
        a first lower land and a lower semiconductor chip disposed on a top surface of the lower package substrate, a second lower land disposed on a bottom surface of the lower package substrate, a lower inter-package connector disposed on the first lower land, and a lower molding material surrounding side surfaces of the lower semiconductor chip, the lower molding material having an opening to expose a top surface of the lower inter-package connector;

providing a fastening element on a top surface of the lower semiconductor chip;

stacking the upper package on the lower package;

performing a first annealing process to cure the fastening element and remove flux having a halogen element from the upper inter-package connector and the lower inter-package connector;

performing a second annealing process to integrate and connect the upper inter-package connector and the lower inter-package connector.

15. The method of claim 14, wherein the second annealing process is performed in a gas atmosphere containing hydrogen and not containing oxygen and nitrogen.

16. The method of claim 14, further comprising:
placing the lower package on a low stack boat, the lower package having the fastening element on the lower semiconductor chip; and
pressing the upper package to the lower package using an upper stack boat during stacking the upper package on the lower package.

17. The method of claim 14, wherein the lower package further comprises a solder on the second lower land.

18. The method of claim 14, wherein the lower package further comprises an intermediate inter-package connector on the lower inter-package connector in the opening of the lower molding material.

19. The method of claim 18, wherein the upper inter-package connector, the intermediate inter-package connector, and the lower inter-package connector are integrated during performing the second annealing process.

20. The method of claim 14, wherein:
the lower molding material does not cover the top surface of the lower semiconductor chip, and
the fastening element is directly disposed on the top surface of the lower semiconductor chip.

* * * * *